US012622181B2

(12) United States Patent
Cheng et al.

(10) Patent No.: US 12,622,181 B2
(45) Date of Patent: May 5, 2026

(54) PHASE CHANGE MEMORY

(71) Applicant: International Business Machines Corporation, Armonk, NY (US)

(72) Inventors: Kangguo Cheng, Schenectady, NY (US); Juntao Li, Cohoes, NY (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 642 days.

(21) Appl. No.: 18/072,675

(22) Filed: Nov. 30, 2022

(65) Prior Publication Data

US 2024/0180047 A1     May 30, 2024

(51) Int. Cl.
 *H10N 70/00*      (2023.01)
 *H10B 63/00*      (2023.01)
 *H10N 70/20*      (2023.01)
(52) U.S. Cl.
 CPC ........... *H10N 70/823* (2023.02); *H10B 63/24* (2023.02); *H10N 70/011* (2023.02); *H10N 70/231* (2023.02)
(58) Field of Classification Search
 CPC .................................................... H10N 70/823
 See application file for complete search history.

(56) References Cited

U.S. PATENT DOCUMENTS

| | | | | |
|---|---|---|---|---|
| 7,579,613 B2 * | 8/2009 | Lung | .................... | H10N 70/068 |
| | | | | 257/E45.002 |
| 8,497,705 B2 * | 7/2013 | Lung | .................. | G11C 13/0004 |
| | | | | 326/44 |
| 9,023,710 B2 * | 5/2015 | Xu | ........................ | H10N 70/231 |
| | | | | 257/4 |
| 9,356,604 B2 | 5/2016 | Gammel | | |
| 9,437,266 B2 | 9/2016 | Lee | | |
| 10,354,710 B2 | 7/2019 | Petti | | |
| 10,396,125 B2 | 8/2019 | Fantini | | |
| 11,031,059 B2 | 6/2021 | Petti | | |
| 11,223,012 B2 | 1/2022 | Park | | |
| 11,355,188 B2 | 6/2022 | Grobis | | |
| 2009/0045388 A1 * | 2/2009 | Clevenger | ........... | G11C 17/165 |
| | | | | 438/102 |
| 2009/0189142 A1 * | 7/2009 | Chen | .................... | H10N 70/884 |
| | | | | 438/102 |

* cited by examiner

*Primary Examiner* — Mounir S Amer
(74) *Attorney, Agent, or Firm* — Harrity & Harrity, LLP

(57) ABSTRACT

An apparatus includes a substrate that has an upper face; a first electrode that is attached to the upper face of the substrate; a second electrode that is attached to the upper face of the substrate at a distance from the first electrode; and a bridge of phase-change-memory material that is attached to and lies along the upper face of the substrate between and electrically connecting the first and second electrodes. At least a portion of the bridge is thermally switchable between a low resistance solid phase and a high resistance solid phase. In some embodiments, the apparatus also includes access devices that are disposed between the electrodes and the substrate, with the bridge being electrically connected between the access devices. At least a portion of the bridge is thermally switchable between a low resistance solid phase and a high resistance solid phase.

20 Claims, 23 Drawing Sheets

100

500

2501

2504

2506

2508

2518

2524

2520

2510

2502

2526    2512

2528

2601

2630

2614

2618

2610

2502

2626    2612

2700

2600 form precursor structure 2800 etch precursor structure to form electrodes 2900 form spacers 3000 cut ends of phase-change-memory material layer

PHASE CHANGE MEMORY

BACKGROUND

The present invention relates to the electrical, electronic, and computer arts, and more specifically, to non-volatile memory devices.

Phase-change memory (also known as PCM or CRAM (chalcogenide RAM)) is a type of non-volatile random-access memory. Currently, PCM exploits the behavior of chalcogenide glasses, which exhibit different electrical properties in different solid phases (crystalline and amorphous states). In their amorphous phases, chalcogenide glasses have high resistance that can represent, for example, a binary 0, while in their crystalline phases, chalcogenide glasses have low resistance that can represent, for example, a binary 1. In one kind of PCM cell, an electric current is passed through a heating element (often made of titanium nitride) that is adjacent to a glass structure; the electric current is controlled to either quickly heat and quench the glass, making it amorphous, or to hold the glass in its crystallization temperature range for some time (on the order of 5 ns to 100 ns), thereby annealing it to a crystalline state.

Resistance drift refers to the phenomenon that the resistance of the phase change memory does not stay at a constant value after programming, particularly after a RESET operation, after which the phase change material is in amorphous state. Instead, the resistance of the phase change memory changes as a function of time.

SUMMARY

Principles of the invention provide techniques for phase change memory.

In one aspect, an exemplary apparatus includes a substrate that has an upper face; a first electrode that is attached to the upper face of the substrate; a second electrode that is attached to the upper face of the substrate at a distance from the first electrode; and a bridge of phase-change-memory material that is attached to and lies along the upper face of the substrate between and electrically connecting the first and second electrodes. At least a portion of the bridge is thermally switchable between a low resistance solid phase and a high resistance solid phase.

According to another aspect, an apparatus includes a substrate that has an upper face; a first electrode that is attached to the upper face of the substrate; a second electrode that is attached to the upper face of the substrate at a distance from the first electrode; a bridge of phase-change-memory material that is attached to and lies along the upper face of the substrate between and electrically connecting the first and second electrodes; and access devices that are disposed between the electrodes and the substrate, with the bridge being electrically connected between the access devices. At least a portion of the bridge is thermally switchable between a low resistance solid phase and a high resistance solid phase.

According to another aspect, an exemplary apparatus includes a substrate that has an upper face; a first metal word line that extends in a first direction across the substrate at a first distance above the substrate; a metal bit line that extends across the substrate in a second direction that is different than the first direction, at a second distance above the substrate, which is less than the first distance; a first word electrode that is attached to and protrudes from the upper face of the substrate below the first word line; a first contact via that electrically connects the first word electrode to the first word line; a first bit electrode that is attached to and protrudes from the upper face of the substrate below the bit line and is electrically connected to the bit line; a first bridge of phase-change-memory material that is attached to and lies along the upper face of the substrate between and electrically connecting the first word electrode and the first bit electrode; and access devices that are disposed between the electrodes and the substrate, with the first bridge being electrically connected between the access devices.

In view of the foregoing, techniques of the present invention can provide substantial beneficial technical effects. For example, one or more embodiments provide one or more of:

Two access devices that are formed symmetrically at two ends of a phase-change-memory material (PCMM) bridge. Each access device is an ovonic threshold switch (OTS), which serves at least two purposes: (1) as access devices, i.e. controlling delivery of current to the bridge; (2) as thermal barriers to reduce heat loss from the bridge (and thus to reduce PCM programming energy) because of the low thermal conductivity of the access device compared to common metal electrodes.

A PCM bridge link connected to two access devices directly. Unlike prior art cross-point PCM in which selector and PCM cell are on the same stack and have the same areas, the PCM bridge allows freedom to customize the area ratio between selector and bridge. For example, the larger area of the selector (access device) allows lower current density (reducing stress on the selector) while the smaller area of PCMM in the bridge enables higher current density so that programming (phase change) can be localized in the bridge.

A resistive liner attached in parallel to the PCM bridge in order to mitigate resistance drift.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
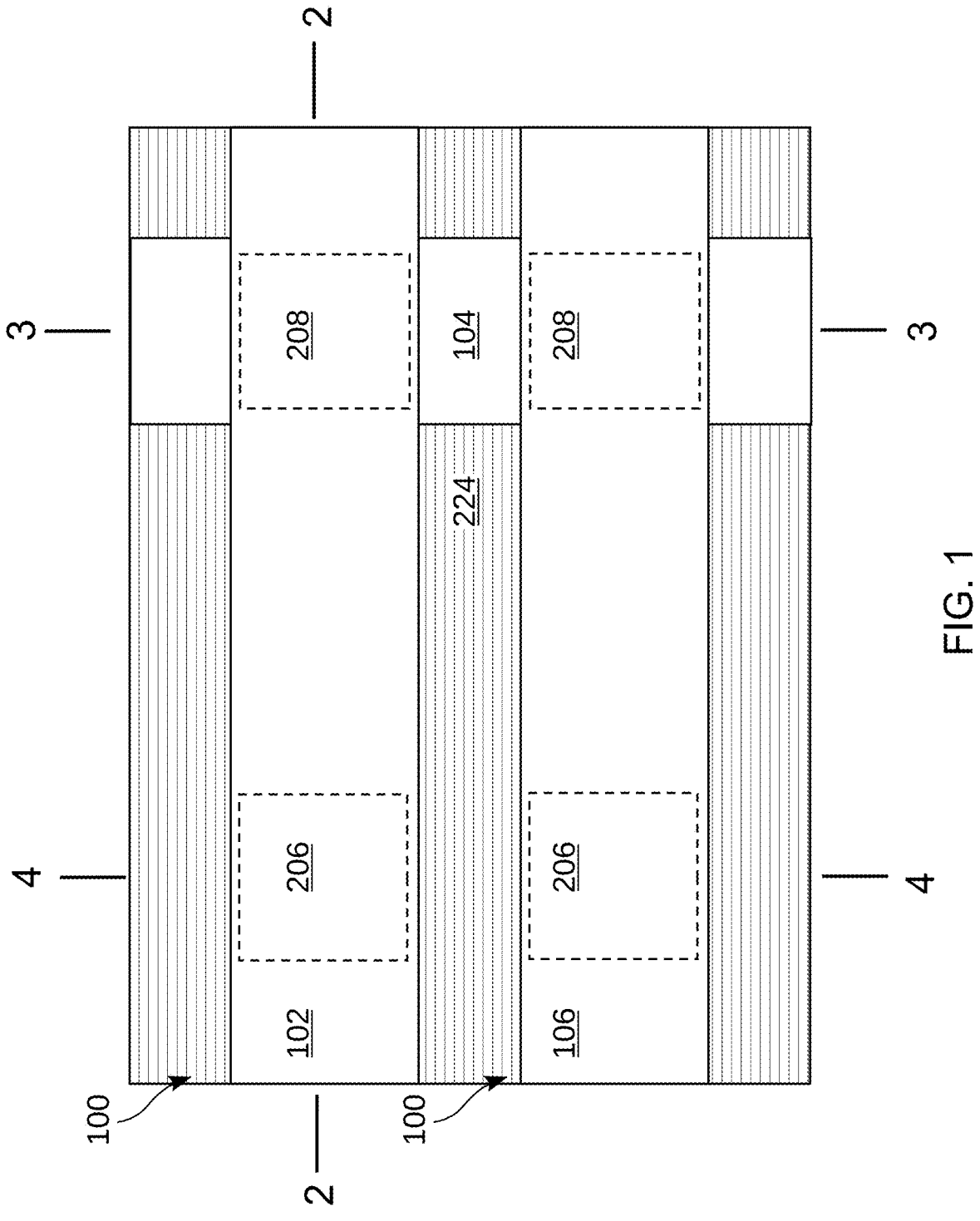
FIG. 1 depicts, in a schematic, a top down (plan) view of an apparatus according to exemplary embodiments.

According to an aspect of the invention, resistance drift is mitigated by disposing a resistive liner in parallel to the phase change memory cell (PCMC). The resistance of the resistive liner is substantially greater than the resistance of the phase change memory material in the low resistance state (e.g., about ten to forty times higher, or in some cases about twenty times higher) and substantially lower than the resistance of the phase change memory material in high resistance state (e.g., about five to fifty times lower, or in some cases about ten times lower). From an electrical perspective, the resistance liner is in parallel to the phase change material. The total resistance read by a reading circuit is a combination resistance of both phase change material and the resistance of the resistive liner. When the phase change material is in the SET state and the resistance drift issue is relatively low, the resistance liner has a reduced effect. On the other hand, when the phase change material in the RESET state (the relatively high resistance state) and the resistance drift is relatively high, the resistive liner can shunt a portion of the read current, diluting the contribution of phase change material to the total resistance and effectively reducing the resistance drift issue In the context of this disclosure, a "phase-change-memory material" or "PCMM" refers to any material that is functionally equivalent to a chalcogenide glass for the purpose of making a phase change memory (PCM) cell; that is, any material that can be switched among a plurality of solid phases by selective thermal cycles of heat-and-quench or heat-and-anneal within temperature ranges compatible with the functioning of a semiconductor device, with each of the plurality of solid phases having distinct electrical properties so that the PCMM can be repeatedly set to any of a plurality of resistance values by controlled thermal transitions. A commonly-used phase-change-memory material is germanium-antimony-tellurium (GST) glass. According to some aspects, alternate phase change materials can be used. For example, a phase change memory bridge cell according to some embodiments can include a phase change material such as germanium-antimony-tellurium (GST), gallium-antimony-tellurium (GaST), silver-iridium-antimony-telluride (AIST) material, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. According to example embodiments, the phase change material(s) can be doped (e.g., with one or more of oxygen (O), carbon C, nitrogen (N), silicon (Si), or titanium (Ti)).

In the context of this disclosure, an "access device" refers an ovonic threshold switch (OTS) that is connected to control delivery of electrical current to a phase-change-memory cell (PCMC). The ordinary skilled worker is familiar with such devices and knows how to construct them, and, given the teachings herein, can implement one or more embodiments by adapting known techniques.

Figure 2:
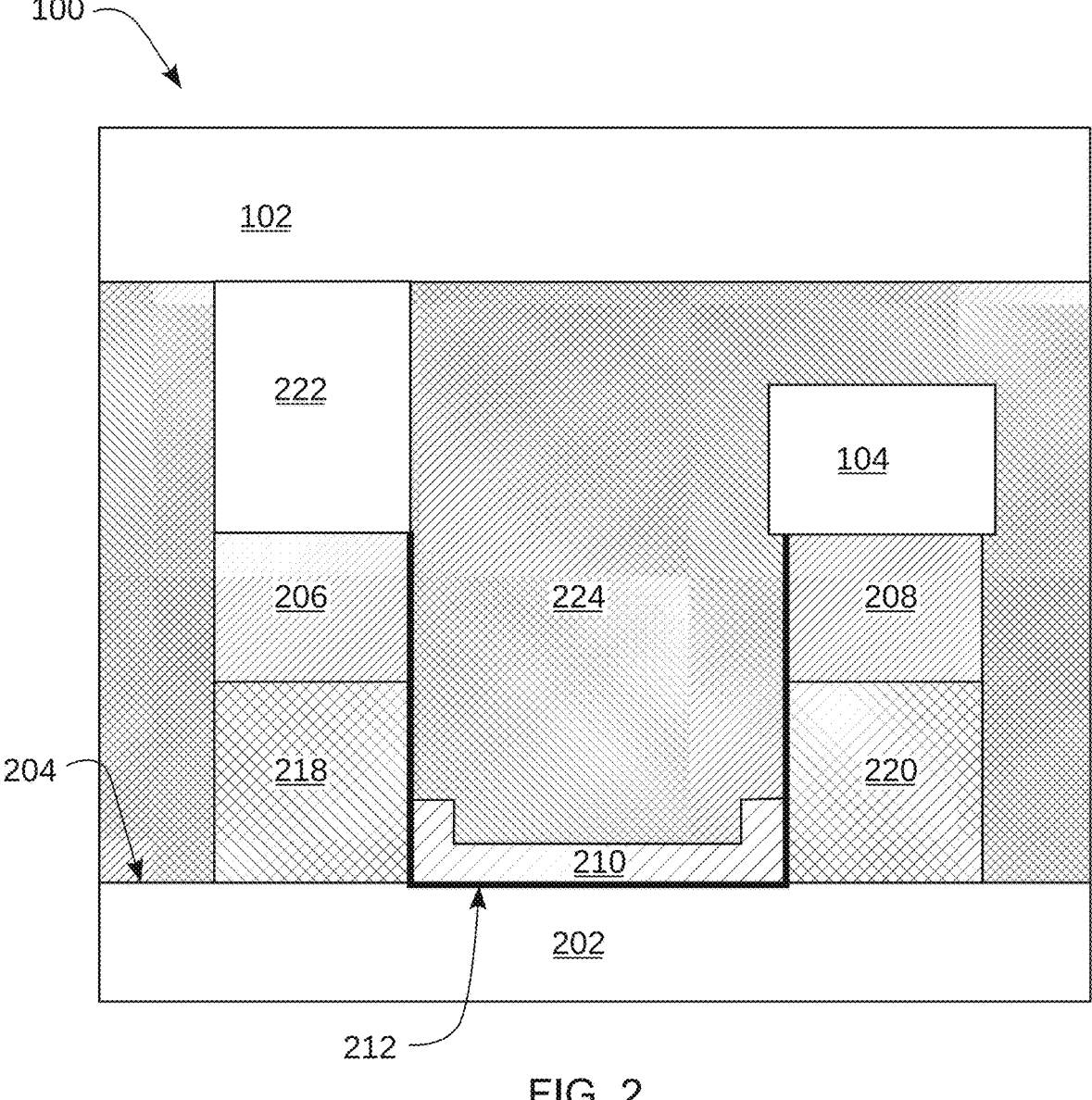
FIG. 2 through FIG. 4 depict, in schematics, side sectional views of the apparatus that is shown in FIG. 1. The views of FIG. 2 through FIG. 4 are taken at corresponding numbered view lines of FIG. 1.
Figure 3:
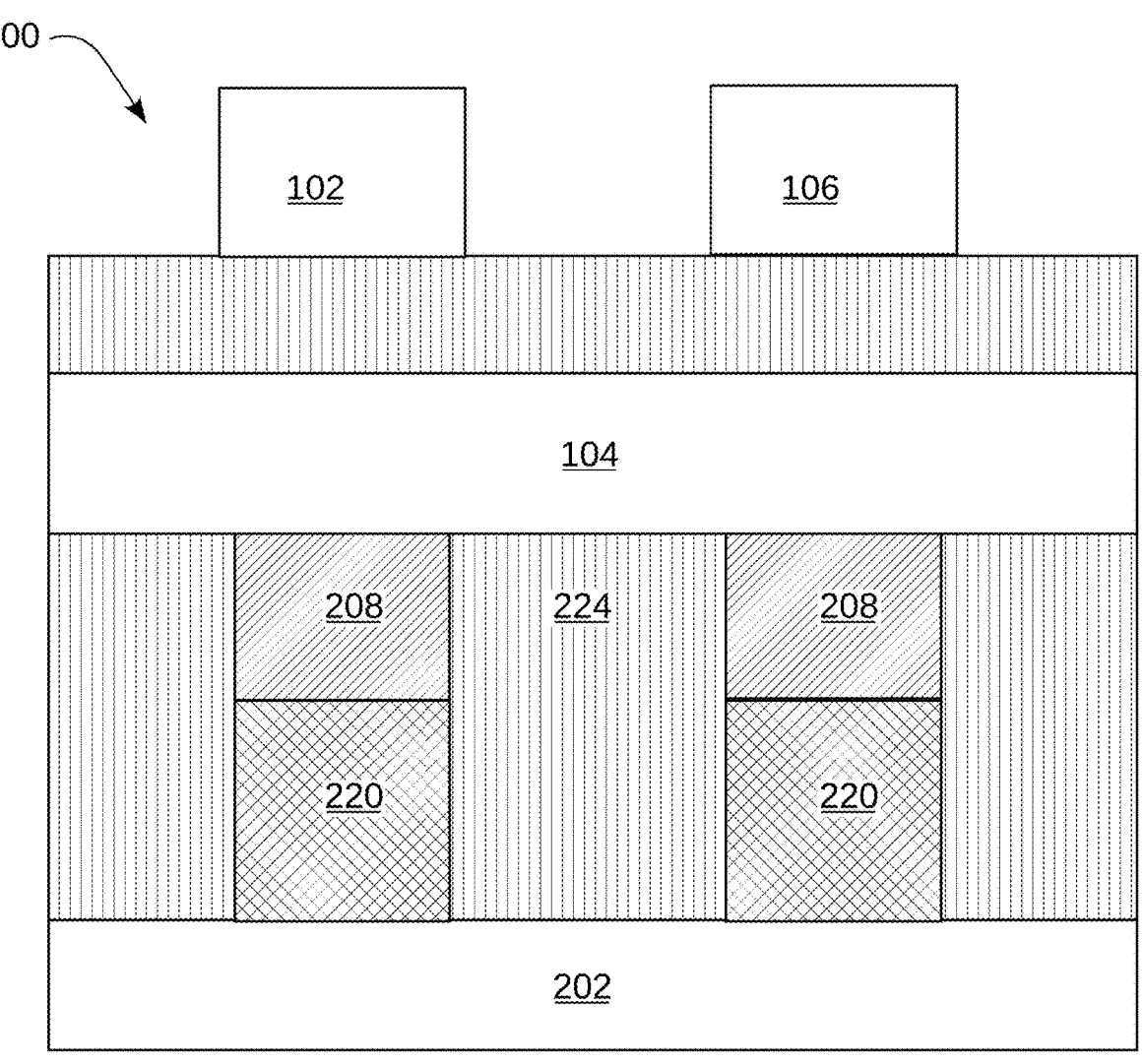
Figure 4:
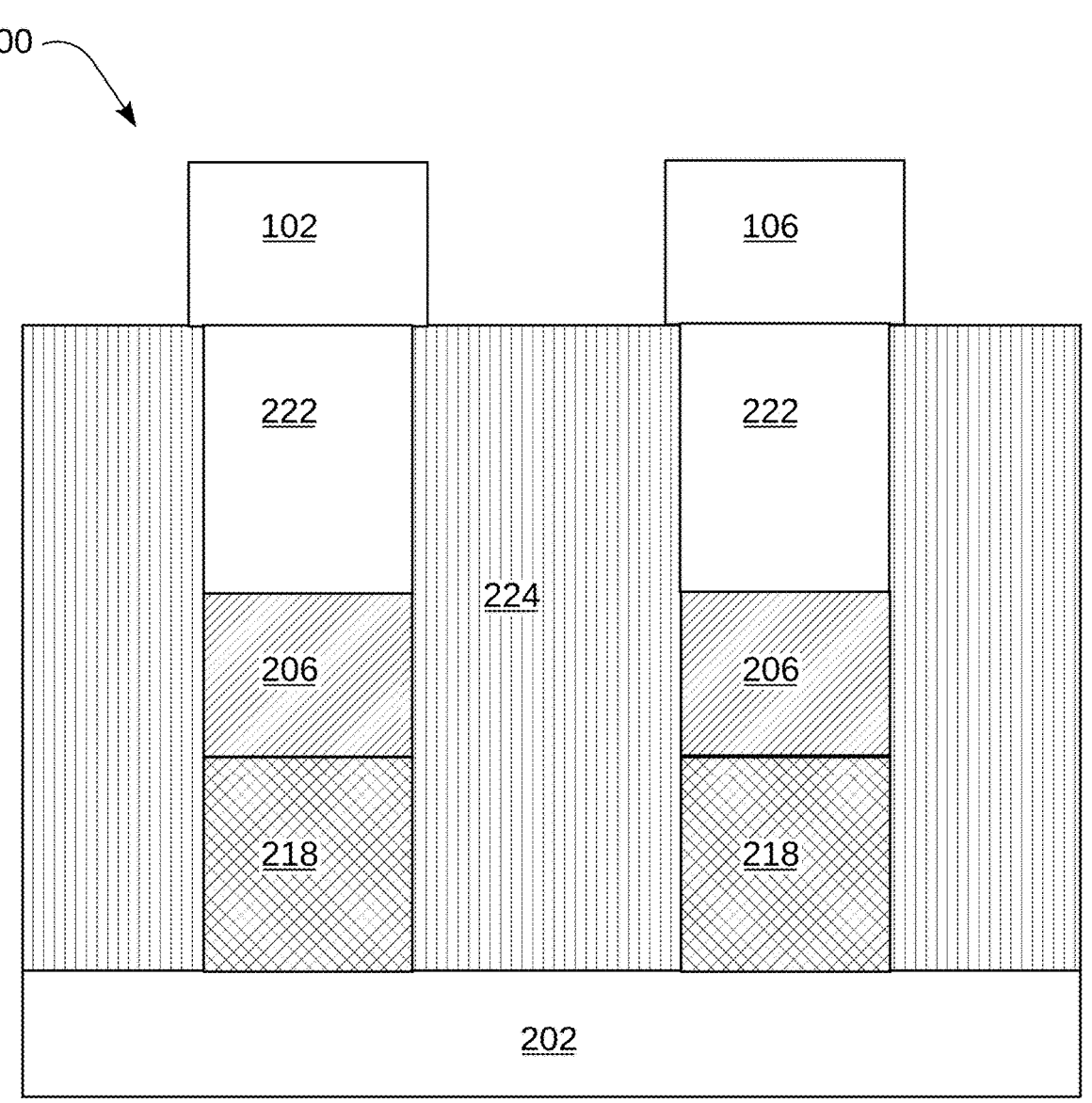

FIG. 1 depicts, in a schematic, a top down (plan) view of an exemplary pair of phase change memory cells 100, according to exemplary embodiments. FIG. 2 through FIG. 4 depict, in schematics, side sectional views of the phase change memory cells that are shown in FIG. 1, along the respective section lines 2-2, 3-3, and 4-4.

Referring to FIG. 1 through FIG. 4, the phase change memory cells 100 include word lines 102, 106 and a bit line 104 that are connected to first electrodes 206 and second electrodes 208. The electrodes 206, 208 are attached to and protrude from an upper face 204 of a substrate 202. A bridge 210 of phase-change-memory material is attached to and lies along the upper face of the substrate between and electrically connects the first and second electrodes. At least a portion of the bridge is thermally switchable between a low resistance solid phase and a high resistance solid phase, according to the inherent characteristics of a phase-change-memory material as described above. A resistive liner 212 extends along a surface of the bridge between the first and second electrodes. In one or more embodiments, the resistive liner includes tantalum nitride. The liner has an electrical resistance greater than that of the bridge in the low resistance state of the bridge and less than that of the bridge in the high resistance state of the bridge. Exemplary resistance values for the liner are between about 200 KΩ and about 2 MΩ. Exemplary resistance values for the bridge in its low resistance state are between about 10 KΩ and about 100 KΩ. Exemplary resistance values for the bridge in its high resistance state are between about 1 MΩ and about 10 MΩ.

An access device 218, 220 is disposed between each of the electrodes 206, 208 and the substrate. The bridge is electrically connected between the access devices. The OTS access device is used to select which PCM cell will be programmed (SET or RESET).

In one or more embodiments, the access devices have relatively low thermal conductivity by comparison to the bridge. Thus, when current passes through the bridge to heat it for a phase change, the access devices present a thermal barrier that makes the heating more efficient, and advantageously reduces energy consumption for changing the state of the bridge from zero to one or vice versa.

In one or more embodiments, the access devices have cross sectional areas (perpendicular to their thicknesses, in the general direction of current flow during operation) that are larger than the cross sectional area of the bridge (perpendicular to its length, in the general direction of current flow during operation). Advantageously, the higher current density in the bridge heats the bridge more effectively, whereas lower current density in the access devices mitigates thermal stress.

In one or more embodiments the electrodes 206, 208 comprise titanium nitride. Other suitable materials include tungsten (W), aluminum (Al), copper (Cu), cobalt (Co), nickel (Ni), titanium (Ti), ruthenium (Ru), molybdenum (Mo), or any other suitable conductive material. As mentioned above, the access devices 218, 220 are ovonic threshold switches. The OTS may be built with a chalcogenic semiconductor material having one single phase (normally amorphous, but sometime crystalline) with two distinct regions of the operation associated to different resistivities. The OTS and the phase change material may be formed adjacent to each other and may be connected to each other through a conducting electrode. Typically, when voltage applied to the OTS is less than a threshold voltage, it shows high resistance; when applied voltage exceeds threshold voltage, the OTS starts to conduct as a low resistance material. For instance, when a memory is to be read, a voltage drop is applied to the cell that is not enough to trigger the phase change when the cell is in its high resistance state. The same voltage drop may be sufficient to change the OTS and PCM cell into the low resistance state when the PCM cell is in the low resistance state. In one or more embodiments, the access devices are ovonic threshold switches. Using ovonic threshold switches advantageously allows the freedom to customize the area ratio between the OTS selector and PCM. For example, the larger area of the OTS selector allows lower current density (reducing stress on the selector) while the smaller area of PCM in the bridge link enables higher current density so that programming (phase change) can localized in the bridge link of the phase change memory cell.

Contact vias 222 electrically connect the electrodes 206 to the word lines 102, 106.

An interlayer dielectric 224 encapsulates the working structures of the phase-change memory cells 100.

Figure 5:
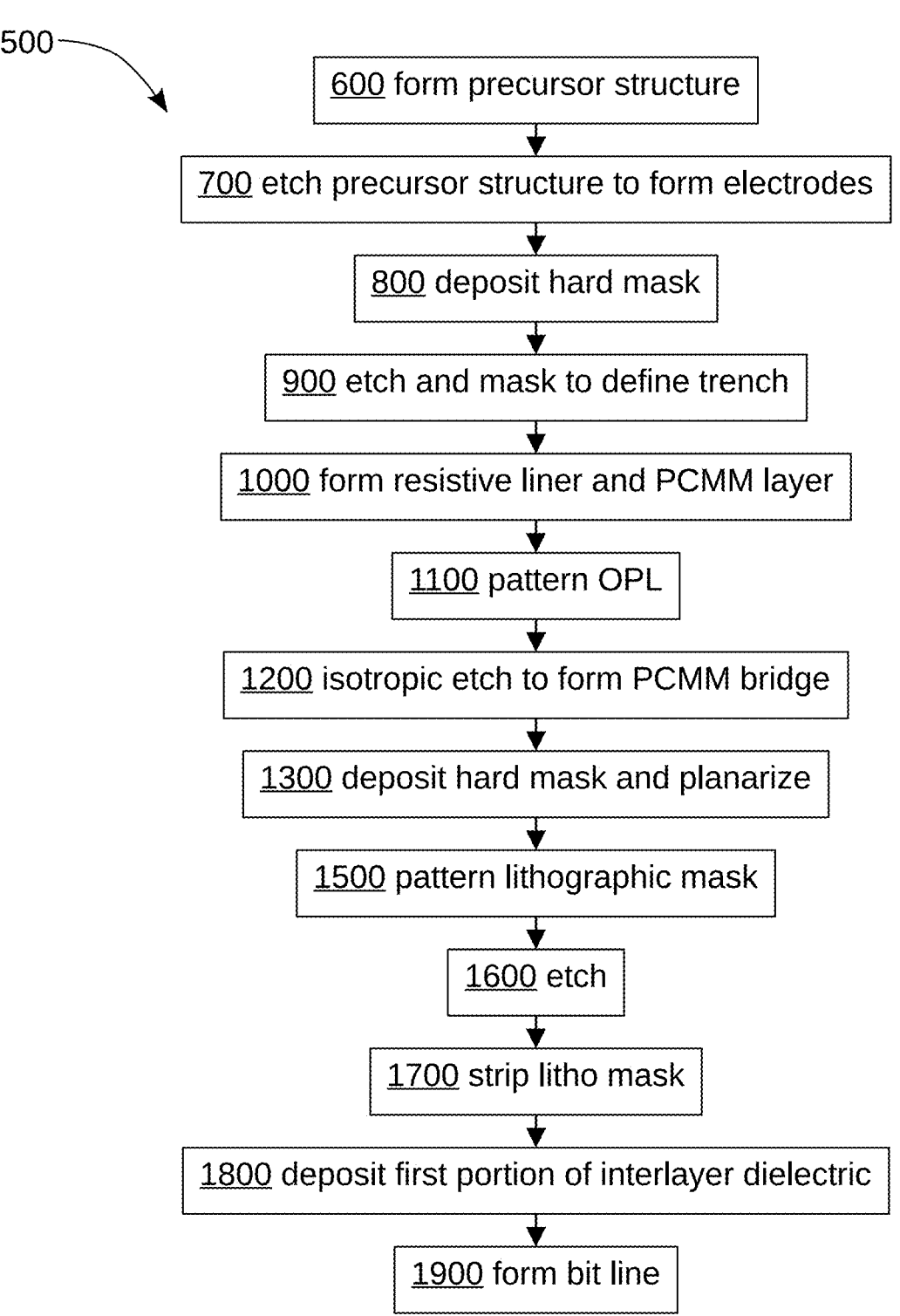
FIG. 5 depicts, in a flowchart, steps of a process for fabricating the apparatus that is shown in FIG. 1 through 4.

FIG. 5 depicts, in a flowchart, steps of a process 500 for fabricating certain embodiments of the apparatus 100 that is shown in FIG. 1 through 4. FIG. 6 through FIG. 19 depict intermediate structures that are formed by steps of the process that is shown in FIG. 5.

Figure 6:
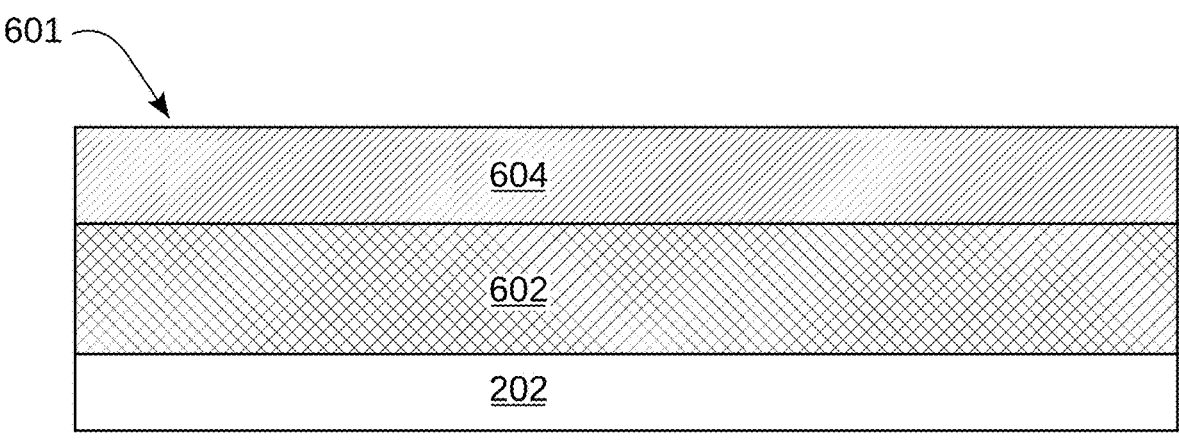
FIG. 6 through FIG. 13 depict, in schematics taken at view line 2-2 of FIG. 1, intermediate structures that are formed by steps of the process that is shown in FIG. 5.

Referring to FIG. 5 and FIG. 6, at 600, form or obtain a precursor structure 601 that includes the substrate 202, an ovonic threshold switch "layer" 602 (the ordinary skilled worker understands that this actually is a stack of several layers, which will become the separate access devices 218, 220), and a metal layer 604 (which will become the separate electrodes 206, 208).

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

Figure 7:
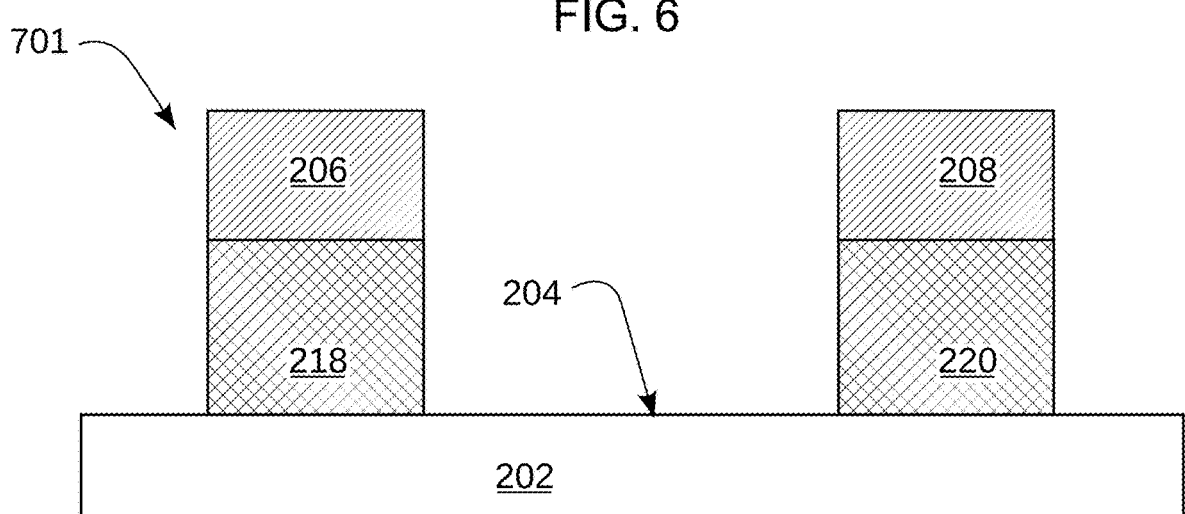

Referring now to FIG. 5 and FIG. 7, at 700, etch precursor structure 601 to form an intermediate structure 701 in which the first electrode 206 and the second electrode 208 protrude from the upper face 204 of the substrate 202.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Figure 8:
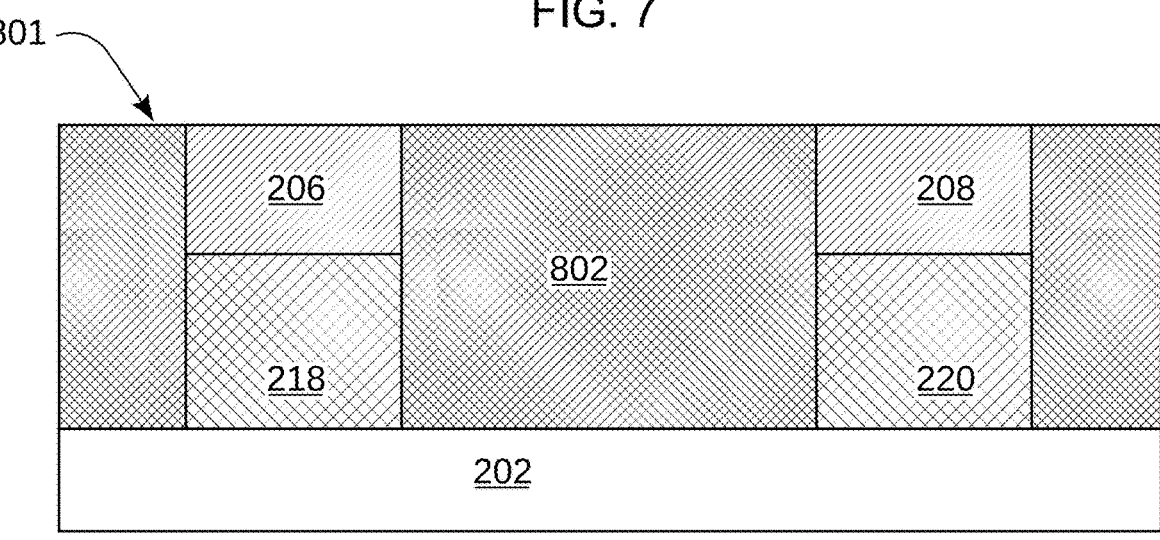

Referring now to FIG. 5 and FIG. 8, at 800, deposit a hard mask 802 (e.g., silicon nitride) to form intermediate structure 801.

Figure 9:
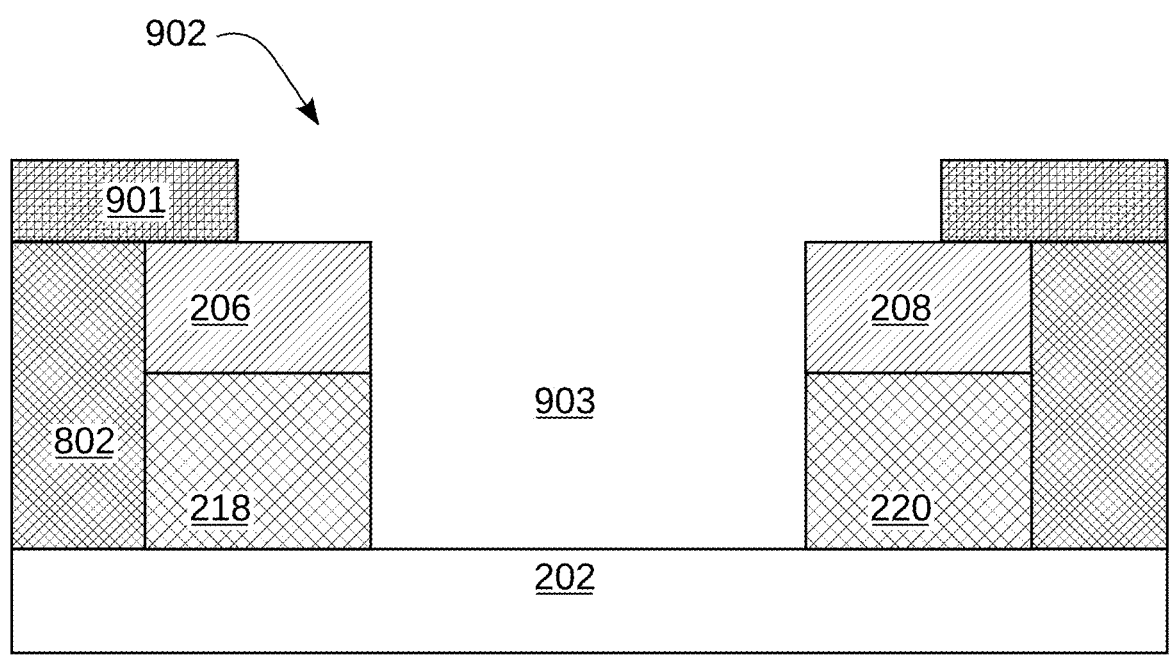
Figure 10:
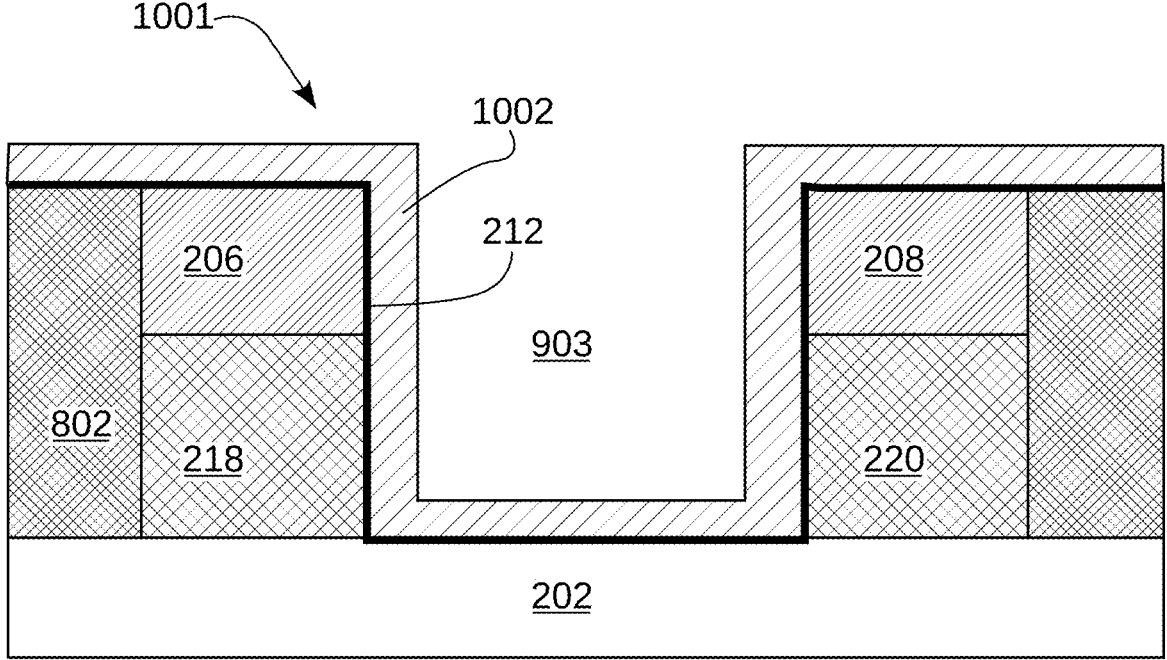

At 900, as shown in FIG. 5 and FIG. 9, develop a photoresist mask 901 and etch to form an intermediate structure 902 with a trench 903 that is defined between the electrodes 206, 208. The ordinary skilled worker is familiar with photolithography, as discussed briefly above. At 1000, as shown in FIG. 5 and FIG. 10, form a structure 1001 that has the resistive liner 212 and a phase-change-memory material (PCMM) layer 1002. The ordinary skilled worker is familiar with processes such as chemical vapor deposition (CVD), plasma enhanced CVD (PECVD), atomic layer deposition (ALD), or physical vapor deposition (PVD), any of which can be used to form the resistive liner and the phase-change-memory material layer.

Figure 11:
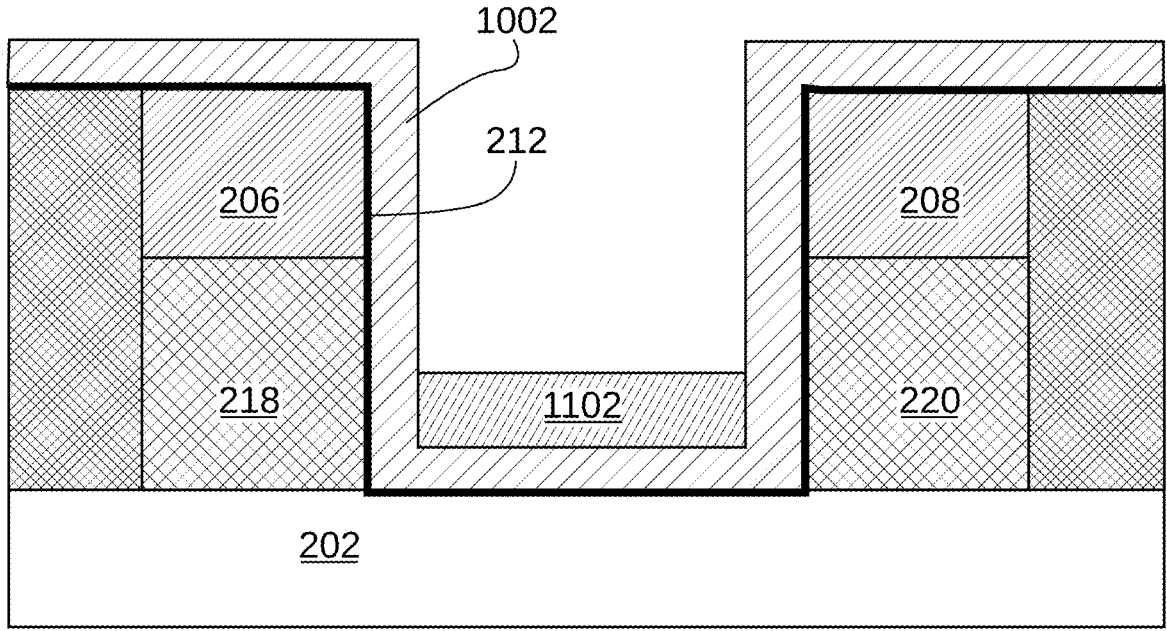
Figure 12:
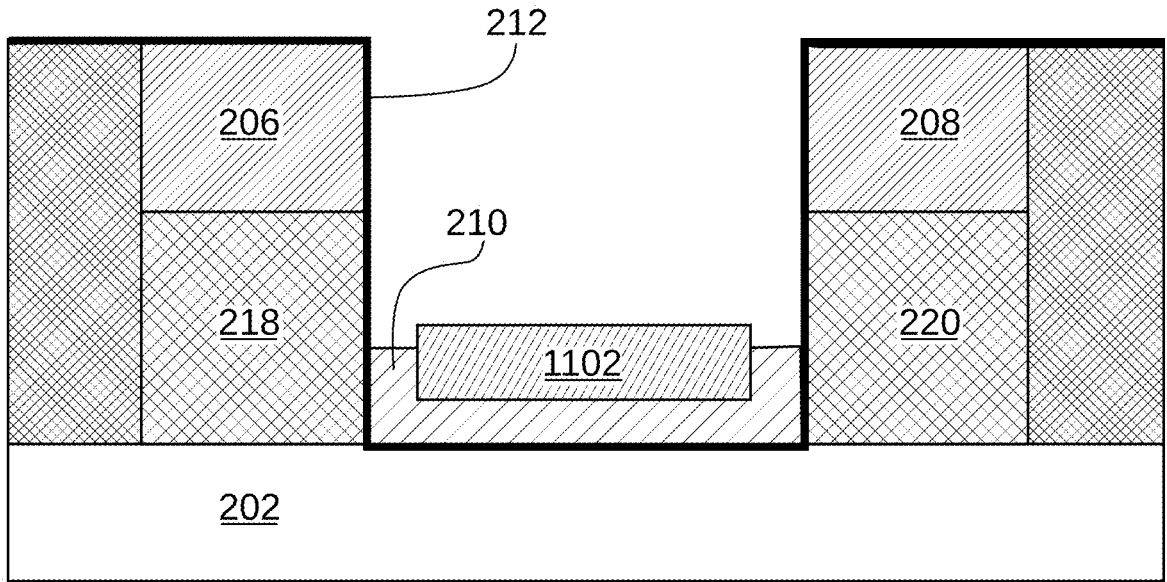

Referring now to FIG. 5, FIG. 11, and FIG. 12, at 1100, pattern an organic planarization layer (OPL) 1102. This will define the structure produced by the subsequent process, at 1200, of isotropically etching the PCMM layer 1002 around the OPL 1102 to form the bridge 210. The ordinary skilled worker is familiar with suitable etchants for PCMM such as GST glass.

Figure 13:
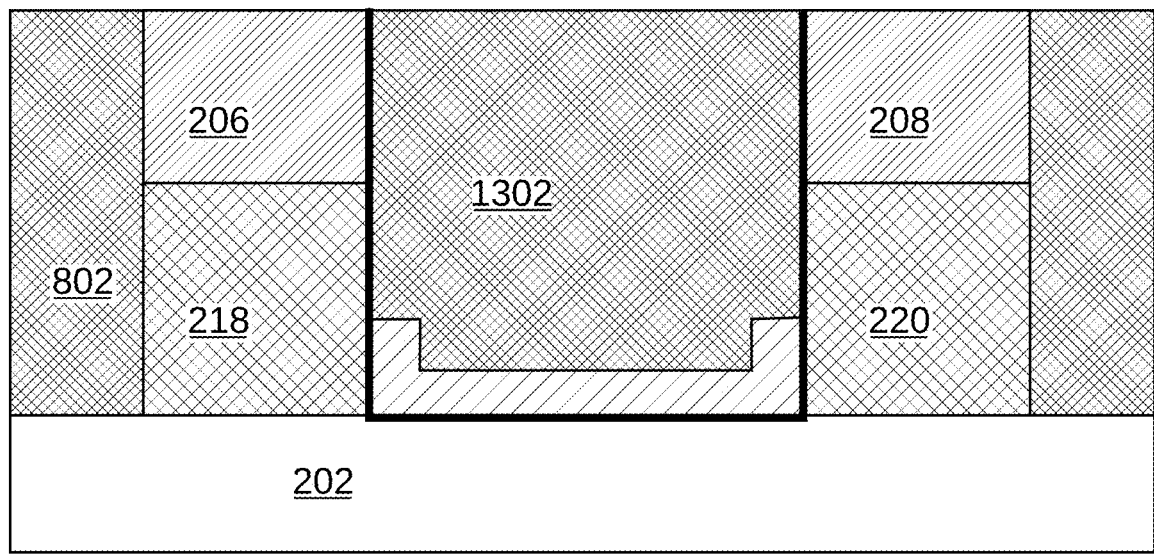
Figure 14:
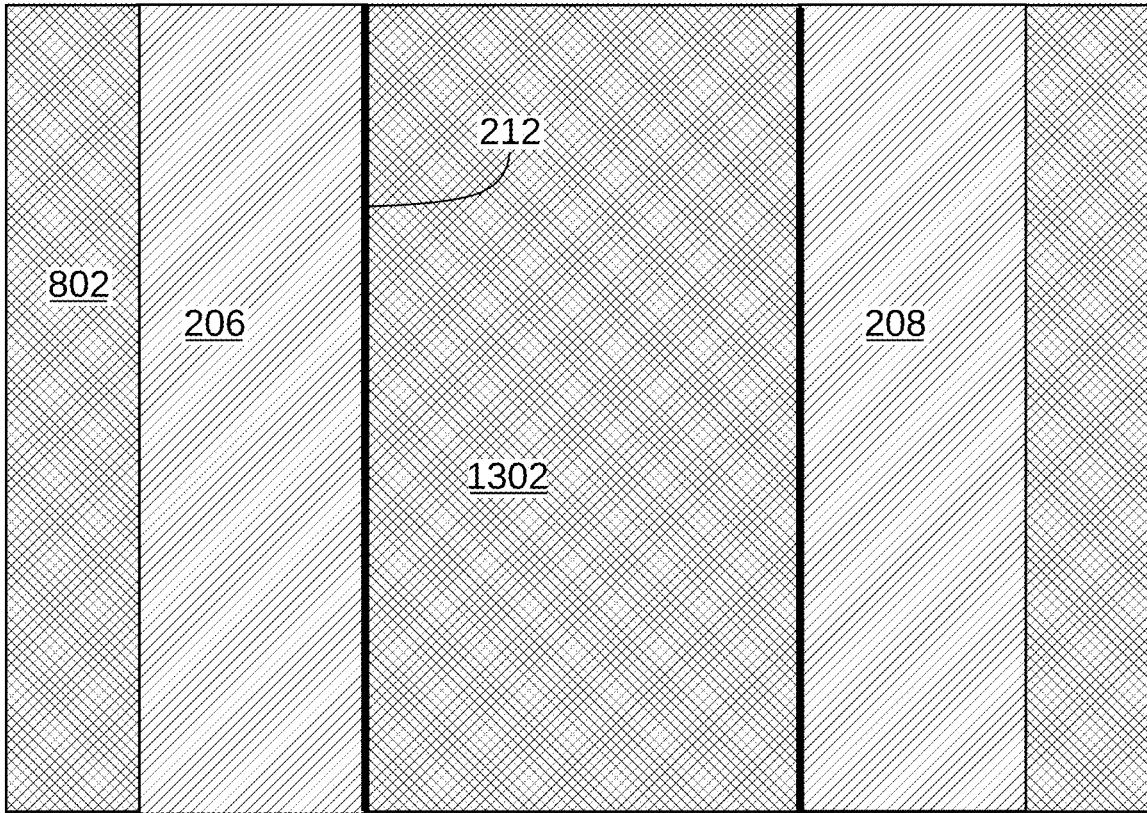
FIG. 14 through FIG. 19 depict, in schematics, top down (plan) views of intermediate structures that are formed by steps of the process that is shown in FIG. 5.

At 1300, as shown in FIG. 5, FIG. 13, and FIG. 14, deposit a dielectric layer 1302 (e.g., silicon nitride [silicon dioxide (SiO2), silicon carbide (SiC), silicon oxynitride (SiON), carbon-doped silicon oxide (SiOC), silicon boron nitride (SiBN), silicoboron carbonitride (SiBCN), silicon oxycarbonitride (SiOCN), organosilicate glass (SiCOH), porous SiCOH, or any another suitable dielectric material used in semiconductor device formation) and planarize. FIG. 14 is a top down (plan) view of FIG. 13.

Figure 15:
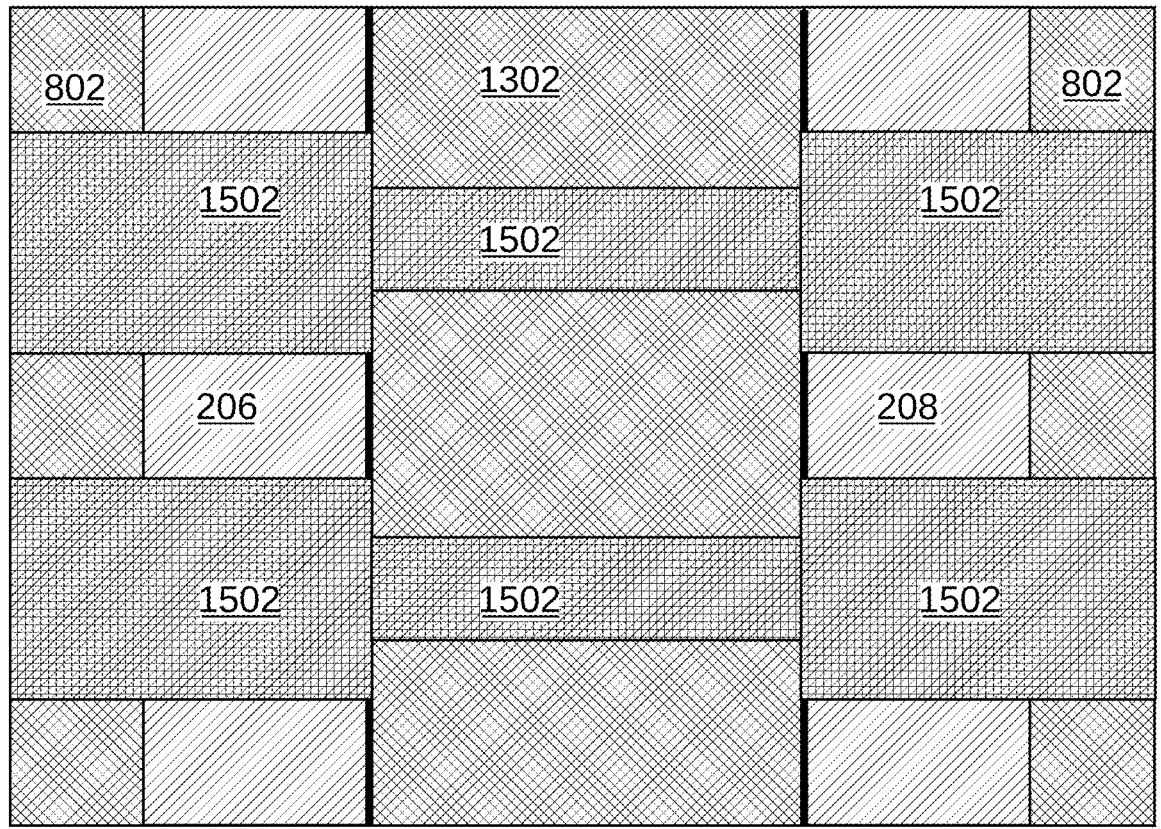
Figure 16:
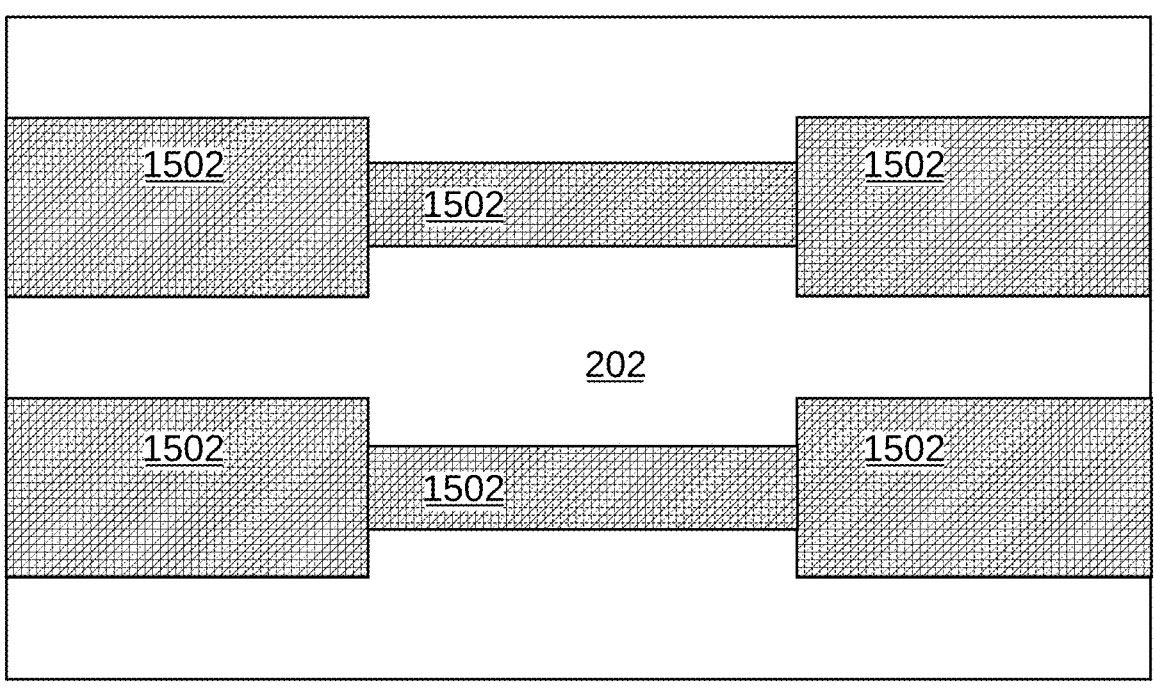
Figure 17:
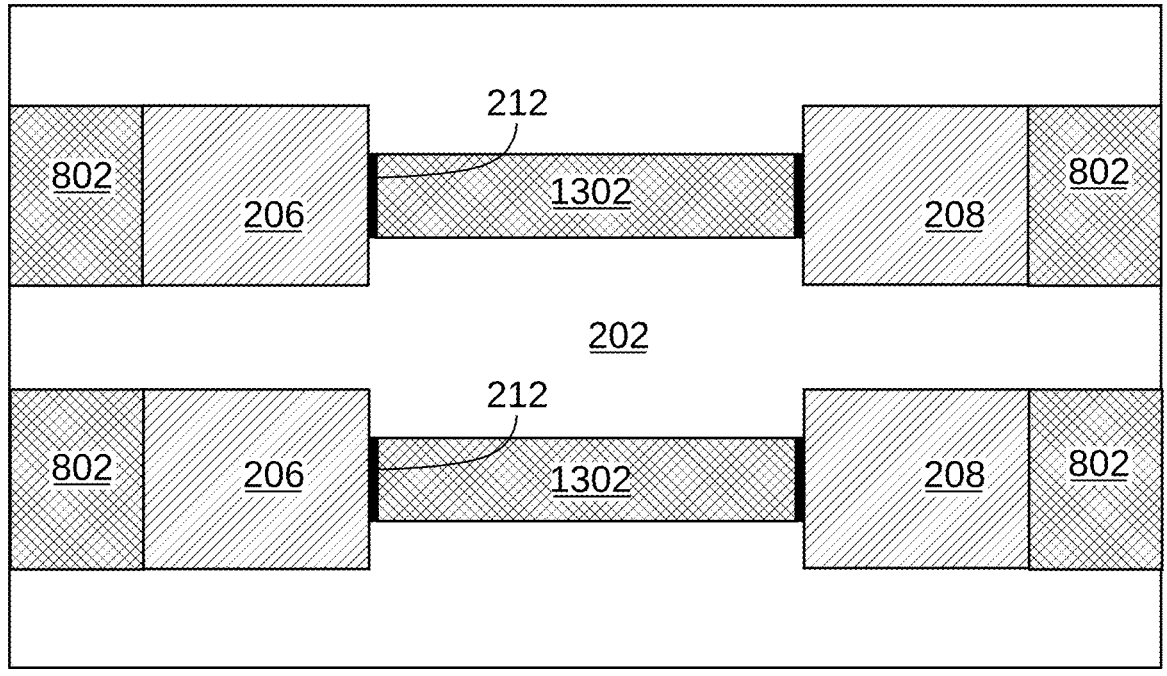

At 1500, as shown in FIG. 5 and FIG. 15, pattern a lithographic mask 1502. At 1600, as shown in FIG. 16, etch. At 1700, as shown in FIG. 17, strip the lithographic mask to reveal the electrodes 206, 208 as well as the liner 212 and remnants of the hard mask 1302.

Figure 18:
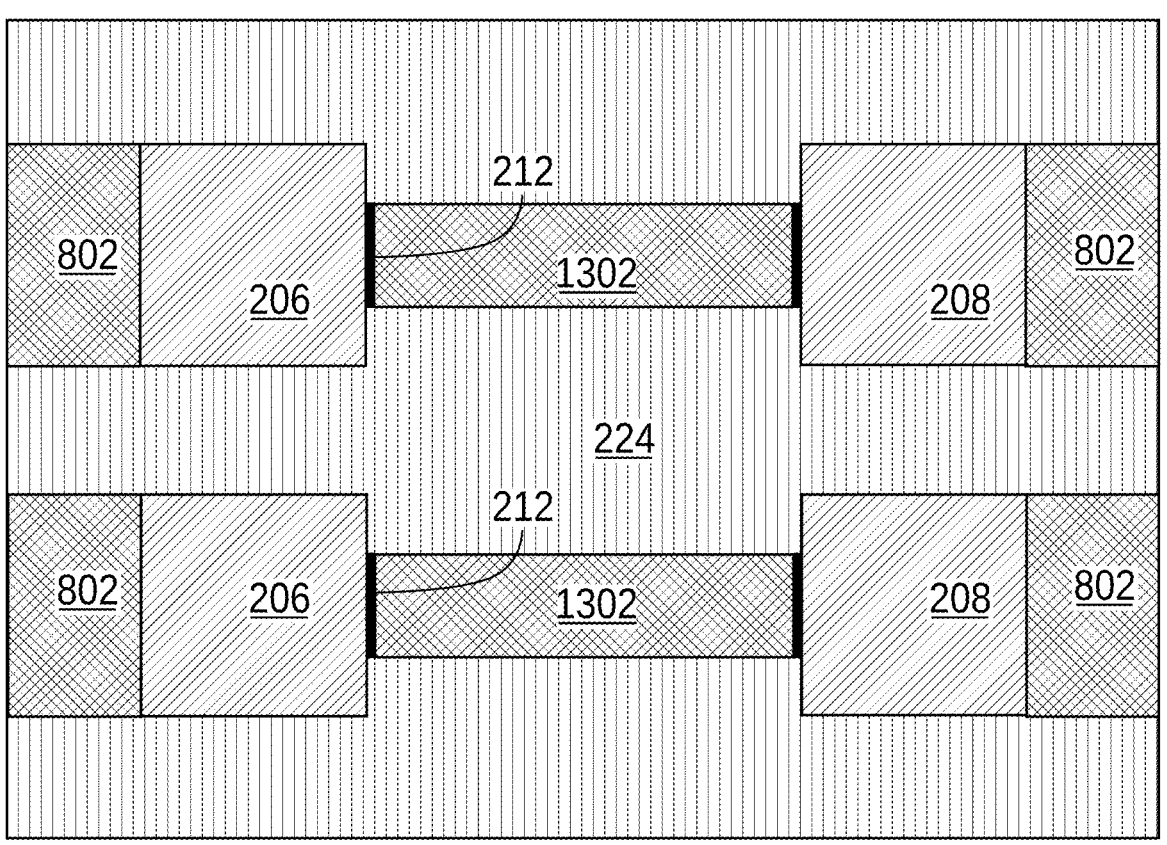

Referring now to FIG. 5 and FIG. 18, at 1800, deposit a first portion of interlayer dielectric 224 and planarize.

Figure 19:
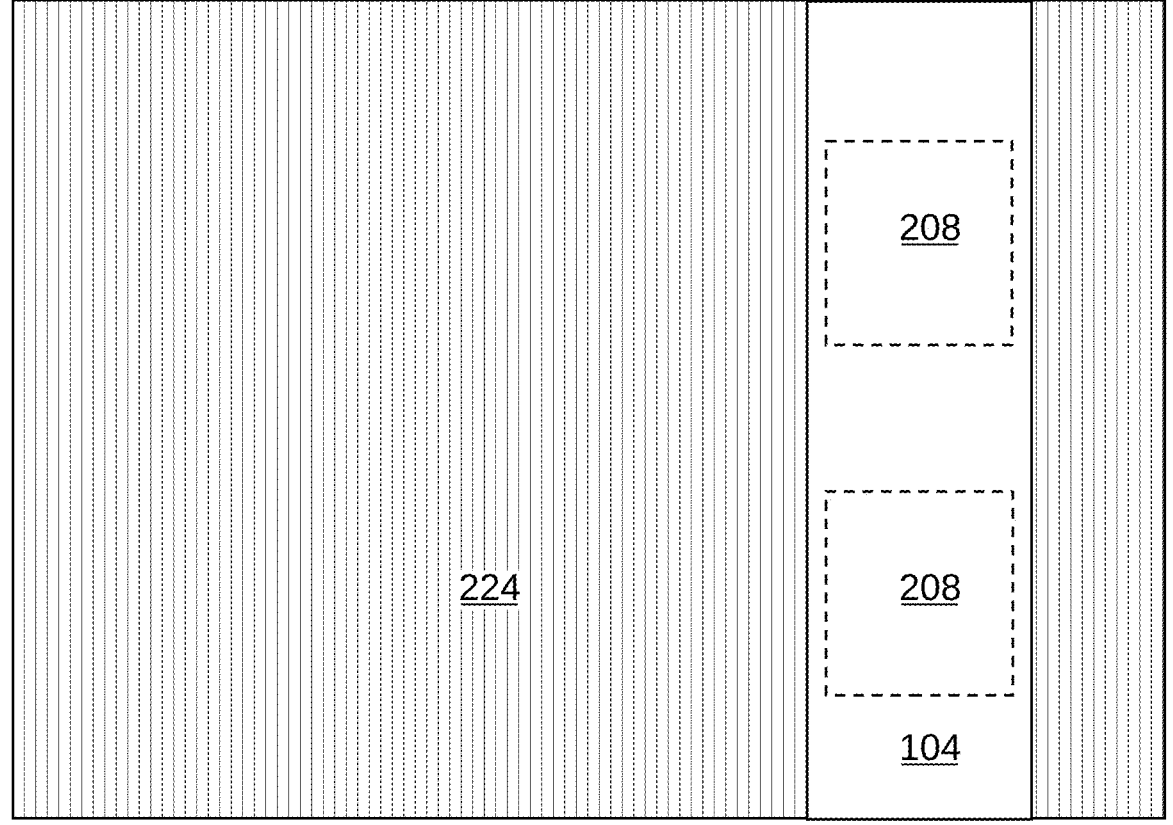

Referring now to FIG. 5 and FIG. 19, at 1900, deposit a second portion of the interlayer dielectric 224, form the bit line 104, and planarize. The electrodes 208 connect the bit line 104 to the underlying phase change memory cells, which are hidden under dielectric 224.

Given the teachings herein, the ordinary skilled worker will be able to adapt known techniques to accomplish subsequent steps of depositing more interlayer dielectric, forming the word lines 102, 106, and planarizing to produce the apparatus 100.

Figure 20:
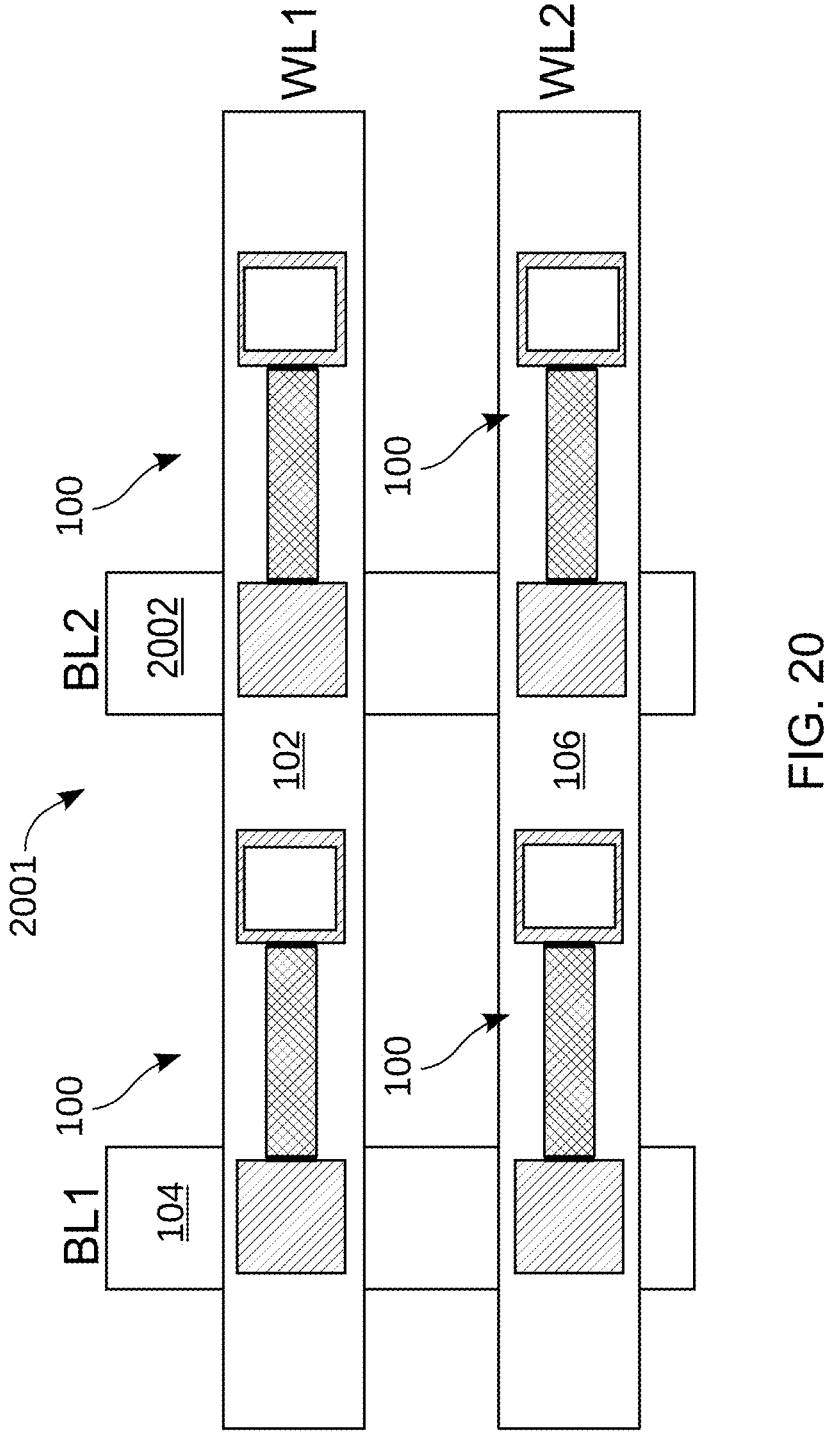
FIG. 20 depicts, in a schematic, a top down (plan) view of an apparatus, according to exemplary embodiments.

Referring to FIG. 20, the techniques of FIG. 5 can be used to form an apparatus 2001 that includes an array of phase-change-memory cells 100 with at least one additional bit line 2002. Note generally first bit line BL1 104, second bit line BL2 2002, first word line WL 102, and second word line WL2 106.

Figure 21:
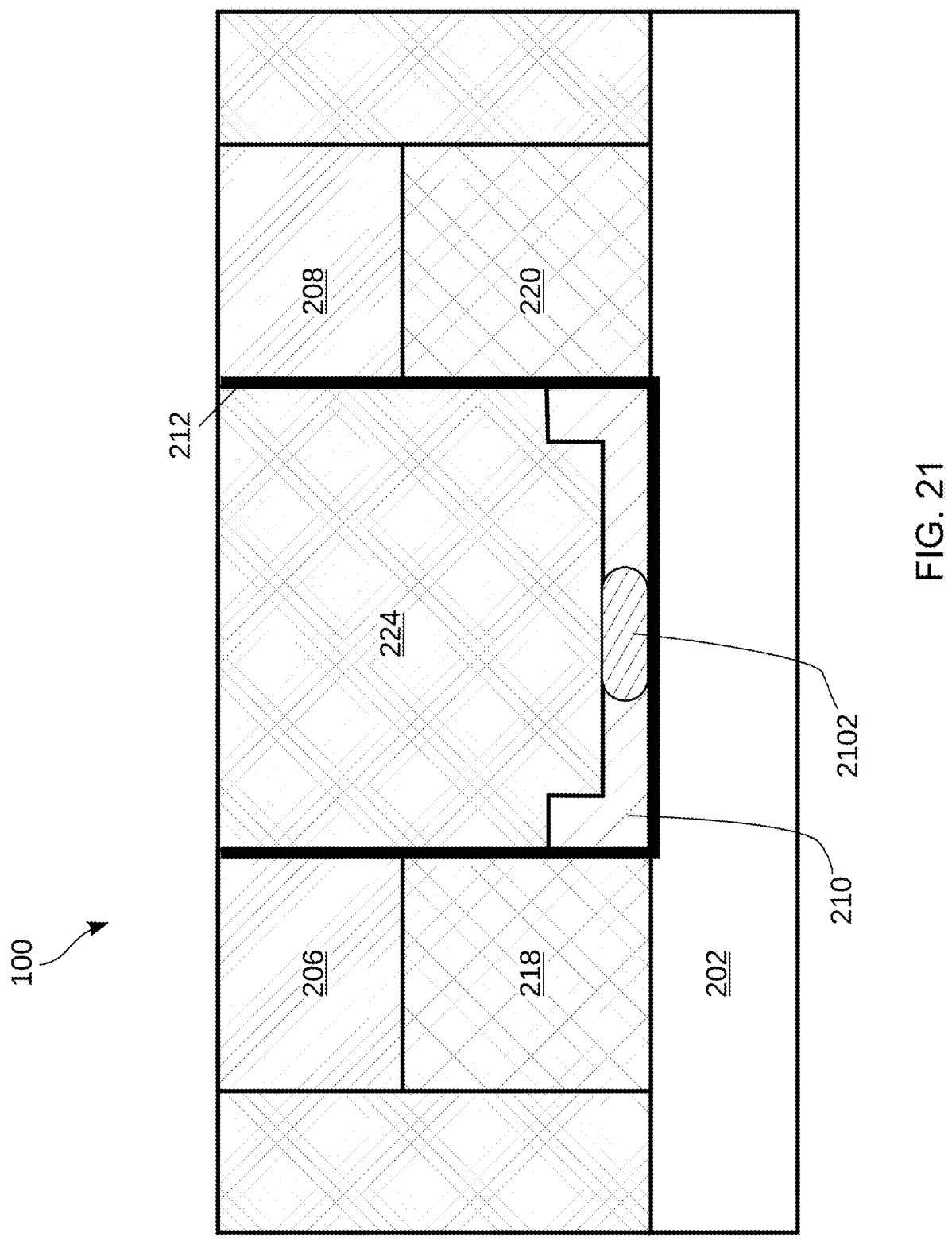
FIG. 21 through FIG. 24 depict, in schematics, side sectional views of other apparatus, according to exemplary embodiments.

FIG. 21 depicts, in a schematic, a snapshot of the operation of the phase-change-memory cell 100, in which a portion 2102 of the bridge 210 has been rendered amorphous (high-resistance) by passing electrical current through the electrodes 206, 208 and the bridge 210.

Figure 22:
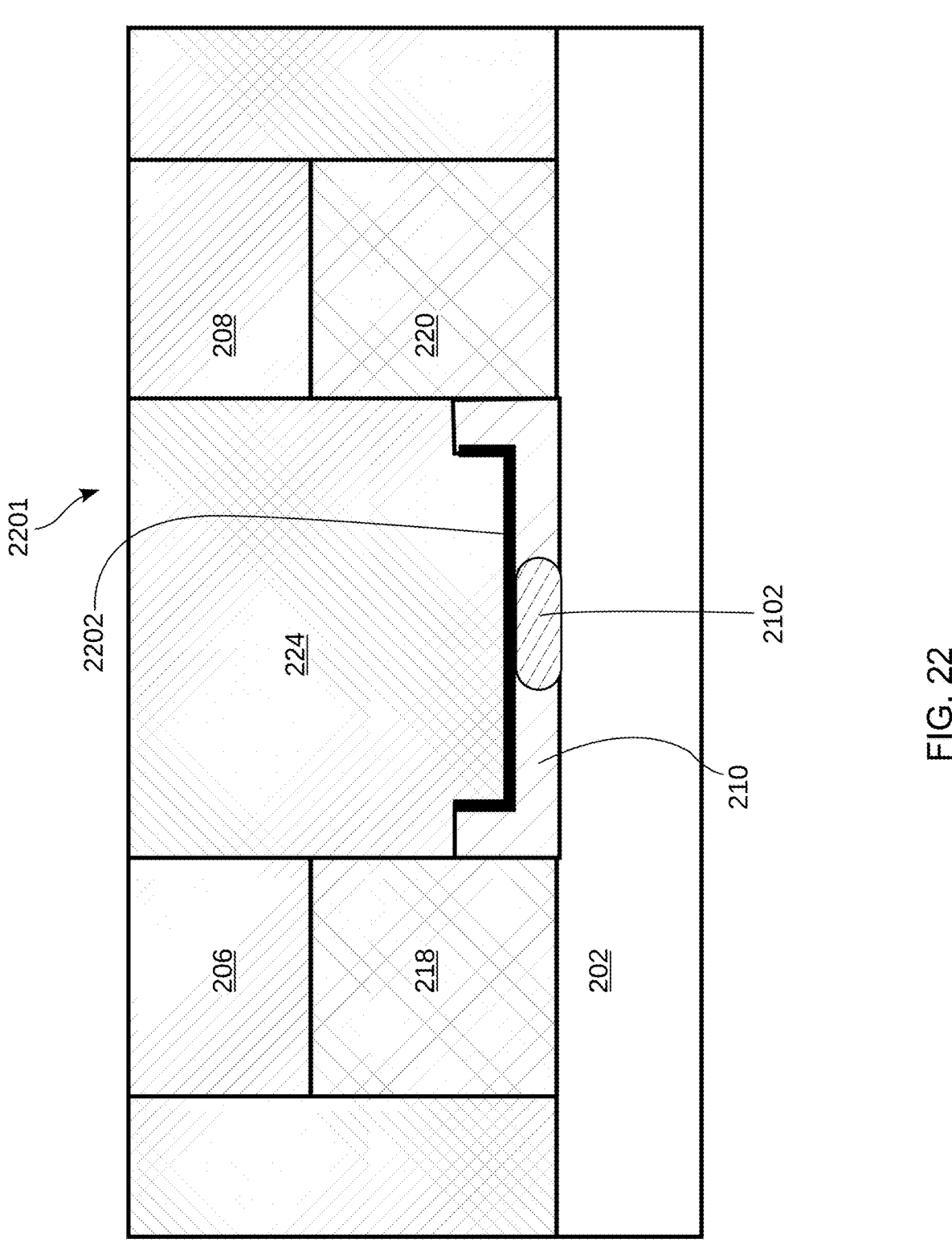
Figure 23:
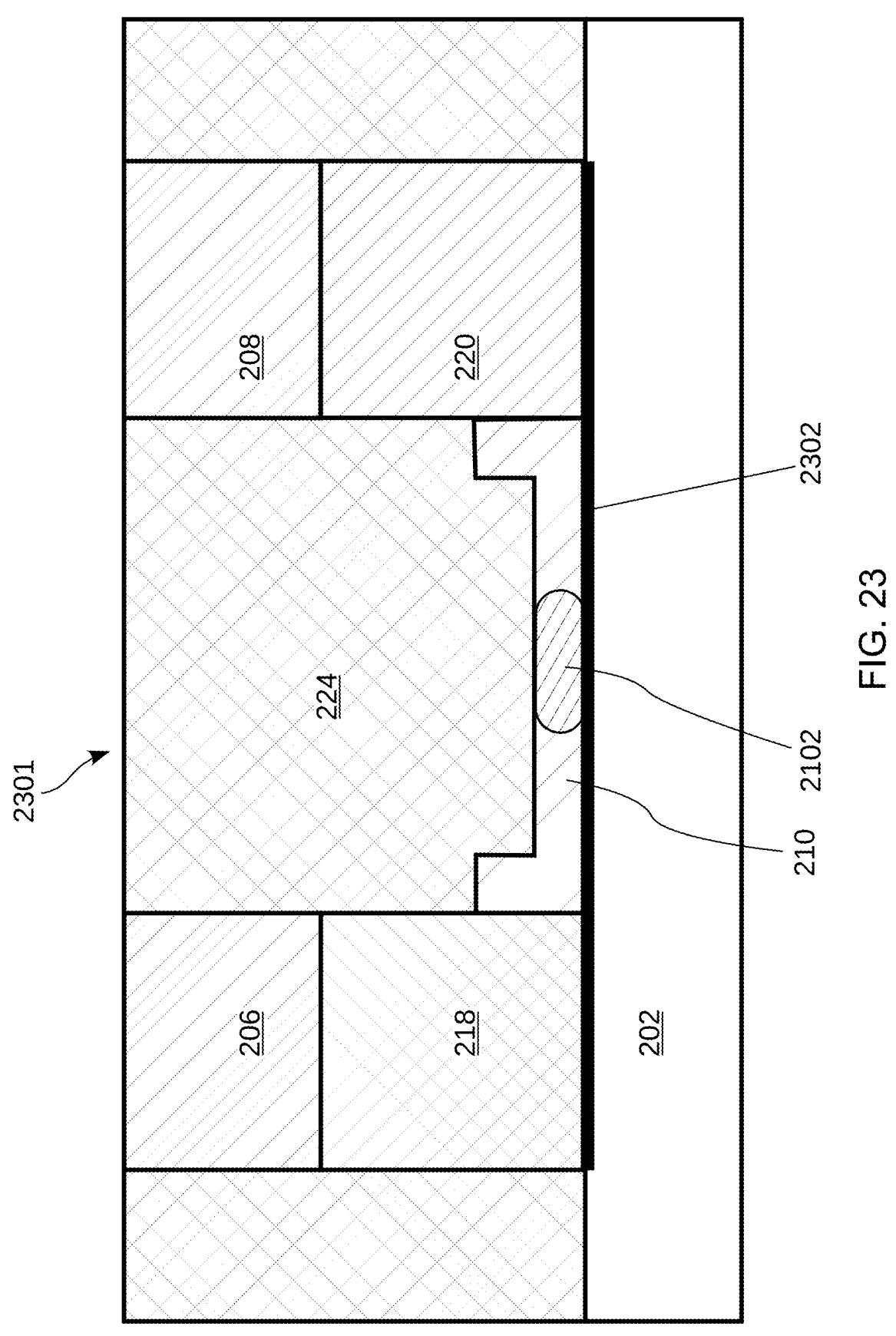
Figure 24:
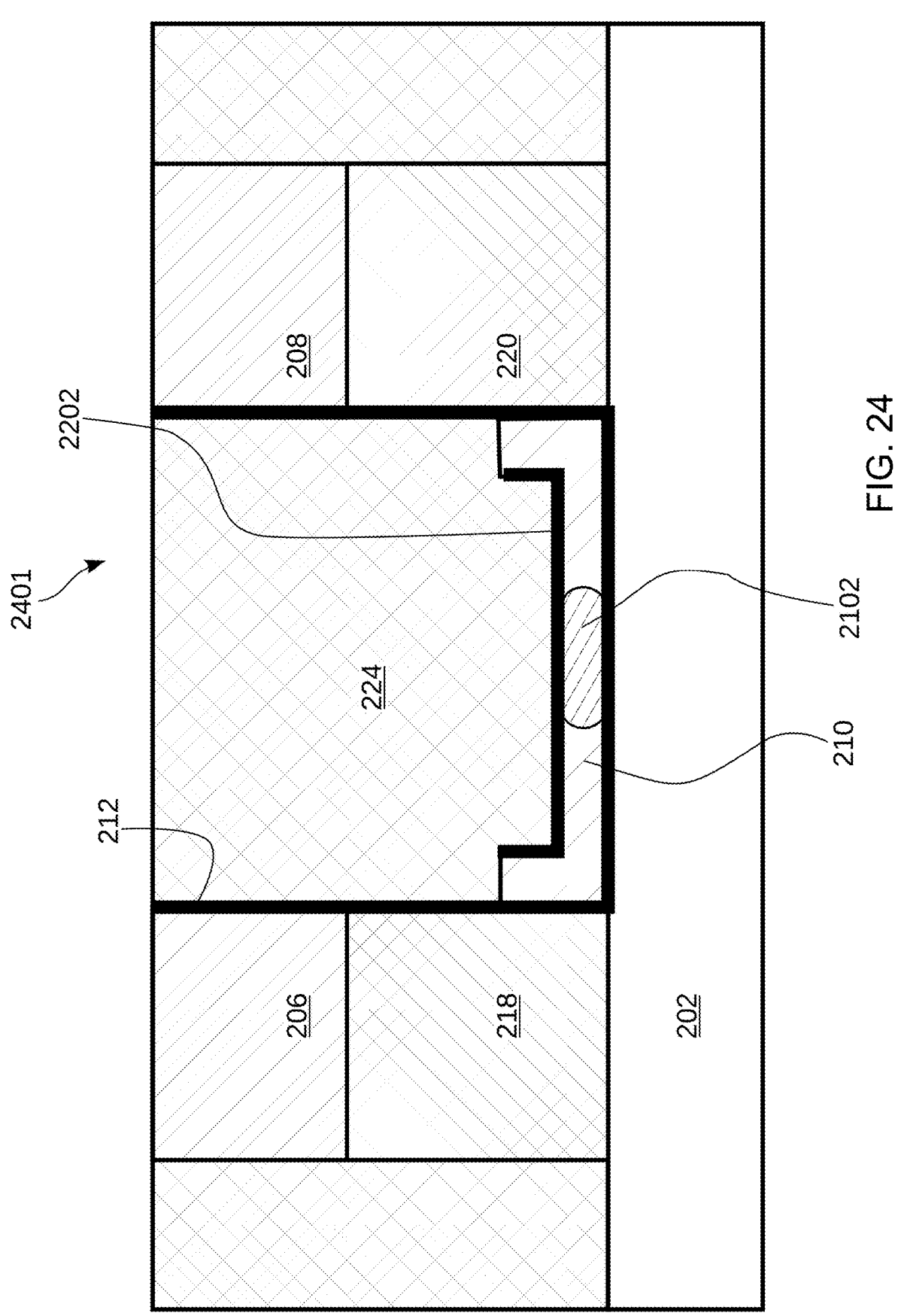

FIG. 22 depicts, in a schematic, a snapshot of the similar operation of a similar apparatus 2201, in which a resistive liner 2202 has been formed on top of the bridge 210. FIG. 23 depicts, in a schematic, a snapshot of the similar operation of a similar apparatus 2301, in which a resistive liner 2302 has been formed beneath the electrodes 206, 208 and the bridge 210. FIG. 24 depicts, in a schematic, a snapshot of the similar operation of a similar apparatus 2401, in which both resistive liners 212 and 2202 have been formed. Given the teachings herein, the ordinary skilled worker will be able to adapt known processes (e.g., lithography, etching, and material deposition) to manufacture structures 2200, 2300, 2400.

Figure 25:
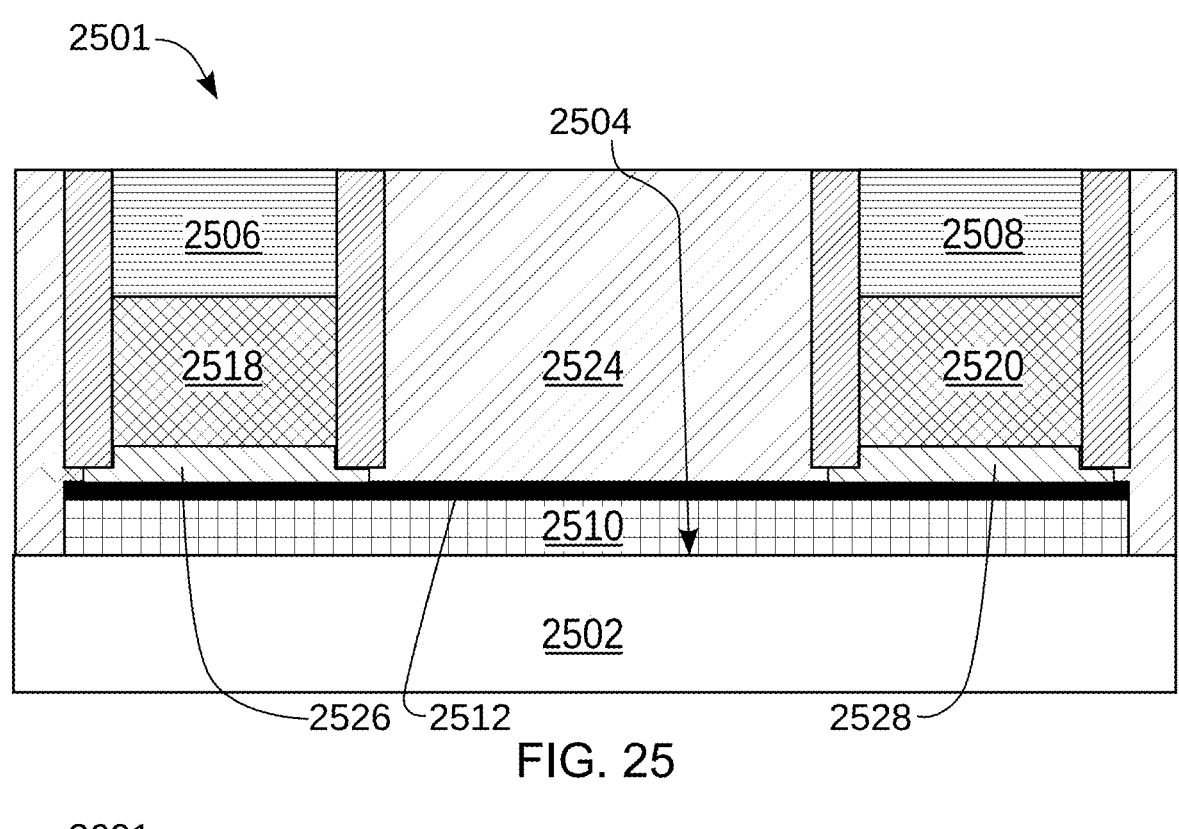
FIG. 25 depicts, in a schematic, a side sectional view of an apparatus, according to exemplary embodiments.

FIG. 25 depicts, in a schematic, a side sectional view of an apparatus 2501 that includes a substrate 2502, which has an upper face 2504. On the upper face of the substrate is a phase-change-memory material bridge 2510, which is covered by a resistive liner 2512. Atop the resistive liner 2512 are electrodes 2506, 2508. A dielectric 2524 encapsulates these working structures. The apparatus 2501 includes electrodes 2506, 2508, access devices 2518, 2520, and metal layers 2526, 2528. The metal layers can include, for example, titanium nitride.

Figure 26:
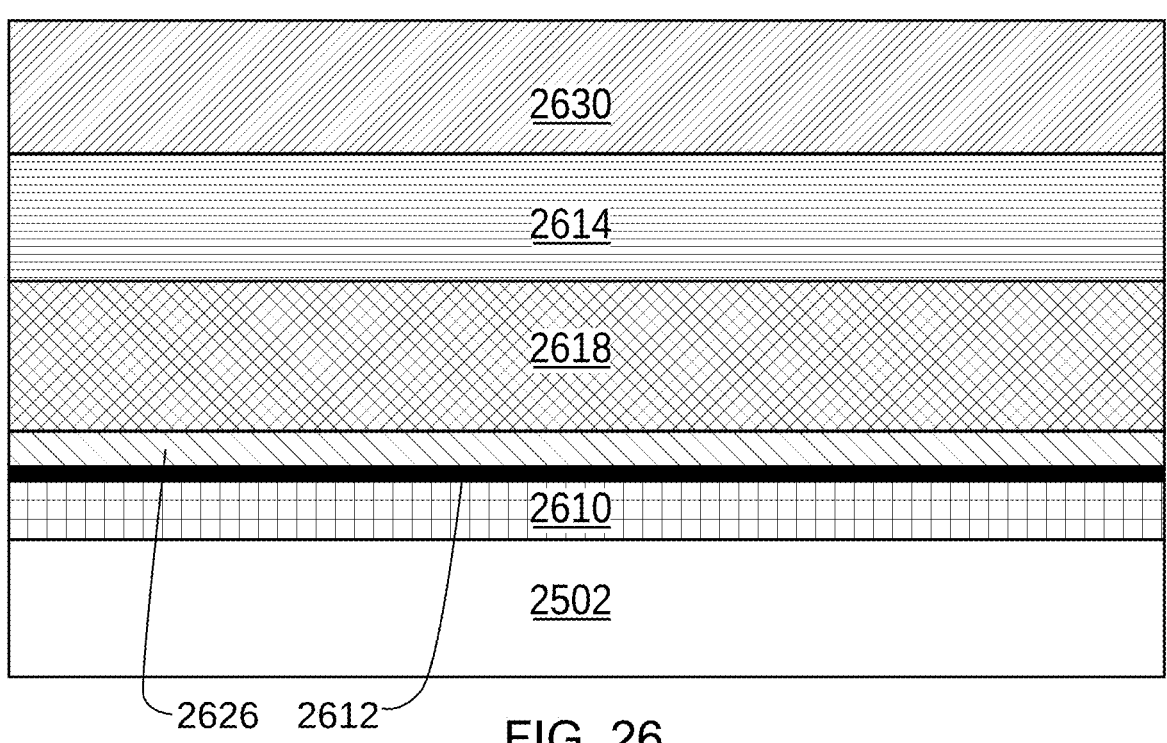
FIG. 26 depicts, in a schematic, a side sectional view of a precursor to the apparatus that is shown in FIG. 25.

FIG. 26 depicts, in a schematic, a side sectional view of a structure 2601 that is a precursor to the apparatus 2501 that is shown in FIG. 25. The precursor structure 2601 includes the substrate 2502, a phase-change-memory material layer 2610, a liner layer 2612, metal layers 2614 and 2626, an access device "layer" 2618 (the ordinary skilled worker will apprehend that this may be a stack of multiple layers to be processed together, and in one or more embodiments there may be structures internal to the stack, details of which are not germane to the inventive aspects of this disclosure), and a hard mask 2630.

Figure 27:
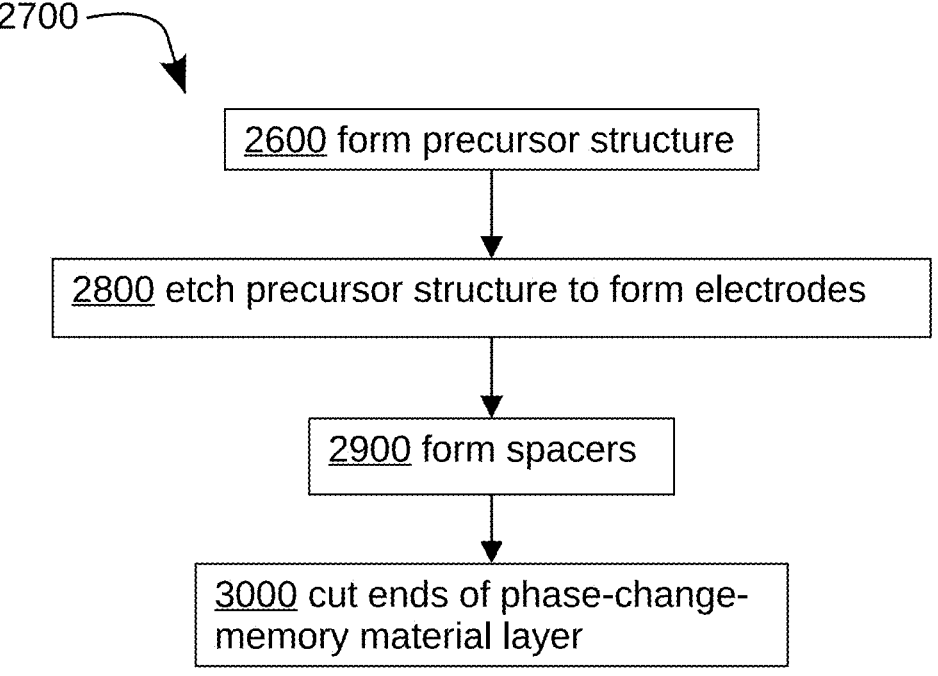
FIG. 27 depicts, in a flowchart, steps of a process for fabricating the apparatus that is shown in FIG. 25.
Figures 28, 29:
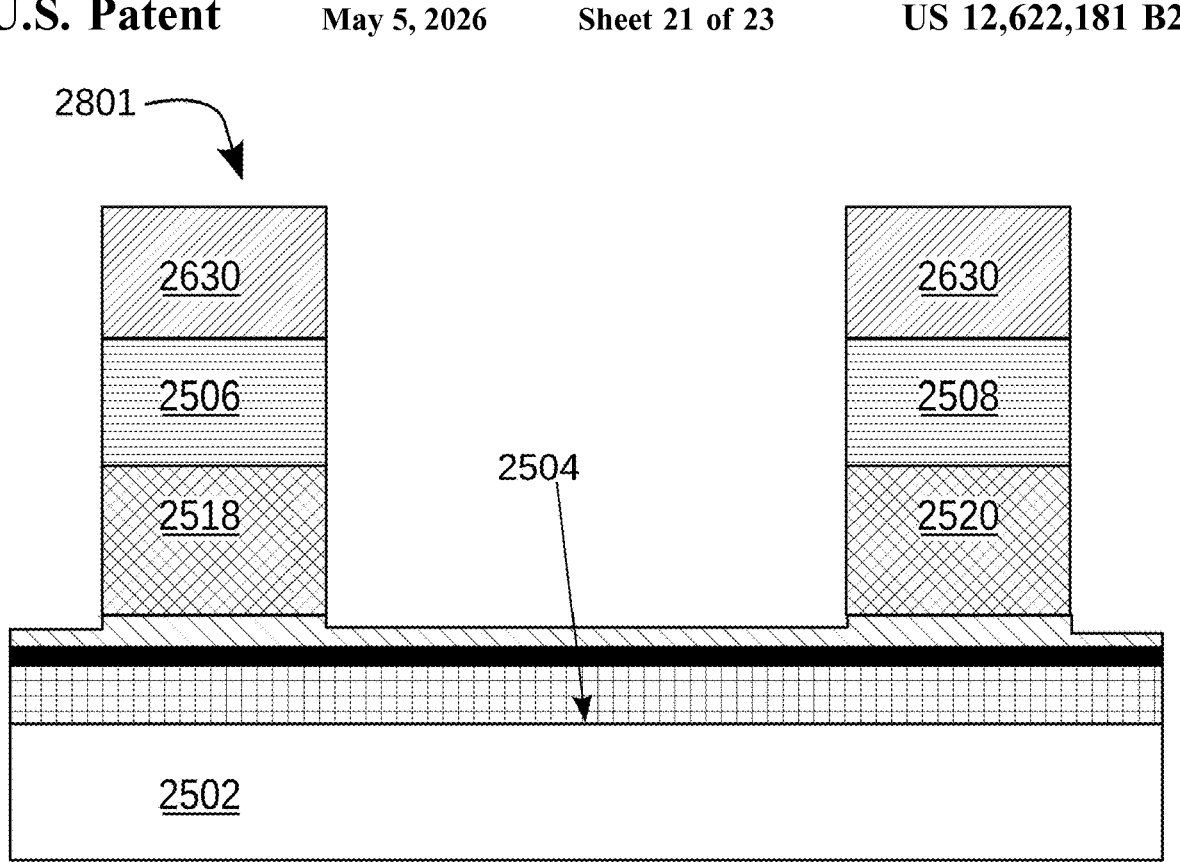
FIG. 28 through FIG. 30 depict, in schematics, side sectional views of intermediate structures that are formed by steps of the process that is shown in FIG. 27.
Figure 30:
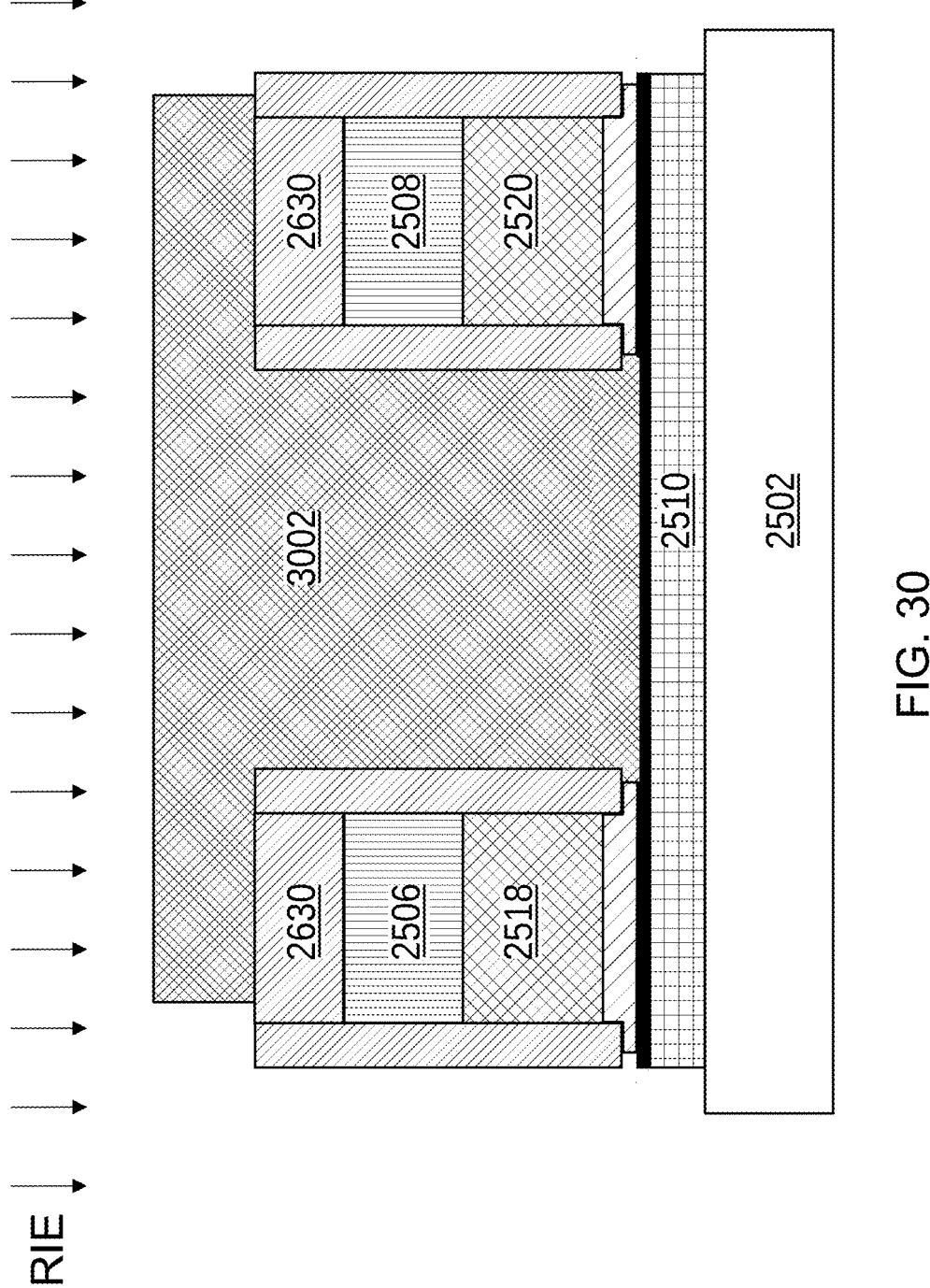

FIG. 27 depicts, in a flowchart, steps of a process 2700 for fabricating the apparatus that is shown in FIG. 25. FIG. 28 through FIG. 30 depict, in schematics, side sectional views of intermediate structures that are formed by steps of the process that is shown in FIG. 27.

Referring to FIGS. 26 and 27, at 2600, form or obtain the precursor structure 2601.

At 2800, as shown in FIG. 28, etch the precursor 2601 to form an intermediate structure 2801 that has the electrodes 2506, 2508 attached to the upper face 2504 of the substrate 2502. In the structure 2801, the access device layer 2618 has been split into separate access devices 2518, 2520 and the metal layer 2614 has been split into separate electrodes 2506, 2508.

At 2900, as shown in FIG. 29, form spacers 2902 in a structure 2901. The ordinary skilled worker is familiar with processes of photolithographic masking and material deposition that can be used to form the spacers.

At 3000, as shown in FIG. 30, mask with a photoresist 3002 and anisotropically etch (e.g., reactive ion etching, ion beam etching) the structure 2901 (shown in FIG. 29) to cut off ends of the phase-change-memory material layer, thereby forming the phase-change-memory material bridge 2510. Given the teachings herein, the ordinary skilled worker will be able to adapt known techniques to complete the structure 2501.

Figure 31:
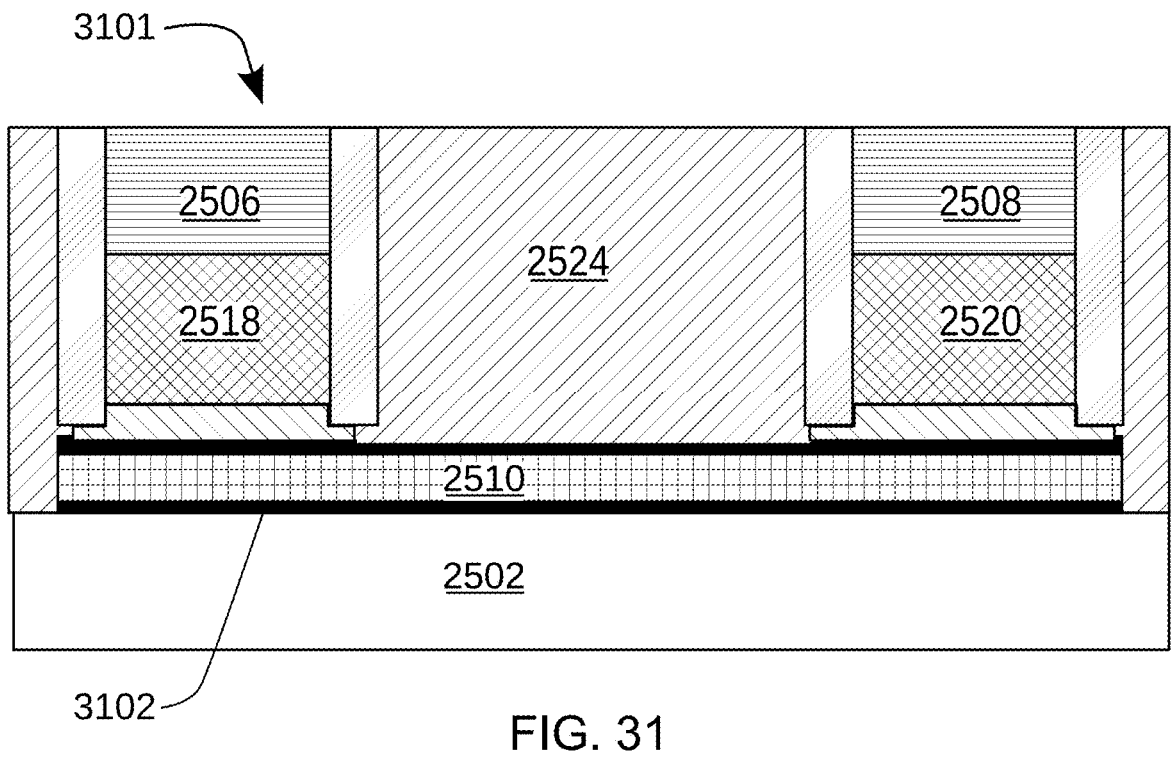
FIG. 31 depicts, in a schematic, a side sectional view of another apparatus, according to exemplary embodiments.

FIG. 31 depicts, in a schematic, a side sectional view of another apparatus 3101, according to exemplary embodiments. In the apparatus 3101, an additional resistive liner 3102 is formed at an interface between the substrate 2502 and the bridge 2510. Given the teachings herein, the ordinary skilled worker will be able to adapt known techniques to complete the structure 3101.

Given the discussion thus far, it will be appreciated that, in general terms, an exemplary apparatus 100/2100/2200/2300/2400/2500 includes a substrate 202 that has an upper face 204; a first electrode 206 that is attached to the upper face of the substrate; a second electrode 208 that is attached to the upper face of the substrate at a distance from the first electrode; and a bridge 210 of phase-change-memory material that is attached to and lies along the upper face of the substrate between and electrically connecting the first and second electrodes. At least a portion of the bridge is thermally switchable between a low resistance solid phase and a high resistance solid phase.

In one or more embodiments, the apparatus also includes a liner 212 that extends along a surface of the bridge between the first and second electrodes. The liner has an electrical resistance greater than that of the bridge in the low resistance state of the bridge and less than that of the bridge in the high resistance state of the bridge. In one or more embodiments, the liner extends along an interface between the bridge and the substrate. In one or more embodiments, the apparatus also includes a second liner 2202 that extends across a surface of the bridge that is opposite the substrate. In one or more embodiments, the liner extends between each end of the bridge and the adjacent electrodes. In one or more embodiments, the liner extends between the electrodes and the substrate.

According to another aspect, an apparatus includes a substrate 202 that has an upper face 204; a first electrode 206 that is attached to the upper face of the substrate; a second electrode 208 that is attached to the upper face of the substrate at a distance from the first electrode; a bridge 210 of phase-change-memory material that is attached to and lies along the upper face of the substrate between and electrically connecting the first and second electrodes; and access devices 218, 220 that are disposed between the electrodes and the substrate, with the bridge being electrically connected between the access devices. At least a portion of the bridge is thermally switchable between a low resistance solid phase and a high resistance solid phase.

In one or more embodiments, the access devices are ovonic threshold switches (OTS). In one or more embodiments, at least one of the access devices in its ON state has lower electrical resistance and lower thermal conductivity than the bridge. In one or more embodiments, the bridge has a smaller cross-sectional area perpendicular to its length compared to larger cross-sectional areas of the first and second access devices perpendicular to their thicknesses.

According to another aspect, an exemplary apparatus includes a substrate 202 that has an upper face 204; a first metal word line 102 that extends in a first direction across the substrate at a first distance above the substrate; a metal bit line 104 that extends across the substrate in a second direction that is different than the first direction, at a second distance above the substrate, which is less than the first distance; a first word electrode 206 that is attached to and protrudes from the upper face of the substrate below the first word line; a first contact via 222 that electrically connects the first word electrode to the first word line; a first bit electrode 208 that is attached to and protrudes from the upper face of the substrate below the bit line and is electrically connected to the bit line; a first bridge 210 of phase-change-memory material that is attached to and lies along the upper face of the substrate between and electrically connecting the first word electrode and the first bit electrode; and access devices 218, 220 that are disposed between the electrodes and the substrate, with the first bridge being electrically connected between the access devices.

In one or more embodiments, the apparatus also includes a second metal word line 106 that extends in the first direction across the substrate at the first distance above the substrate, and is offset by a third distance in the second direction from the first metal word line.

In one or more embodiments, the first bridge has a smaller cross-sectional area perpendicular to its length compared to larger cross-sectional areas of the first and second access devices perpendicular to their thicknesses. In one or more embodiments, the access devices are ovonic threshold switches (OTS).

In one or more embodiments, the apparatus also includes a resistive liner 212 at a surface of the first bridge. The resistive liner is electrically connected between the first and second electrodes, and has an electrical resistance greater than that of the first bridge in the low resistance state of the first bridge and less than that of the first bridge in the high resistance state of the first bridge. In one or more embodiments, the resistive liner is atop the first bridge. In one or more embodiments, the resistive liner is between the upper face of the substrate and the first bridge. In one or more embodiments, the apparatus also includes a second resistive liner 2202 across the top face of the first bridge. In one or more embodiments, the resistive liner extends between the bridge and the access devices.

In one or more embodiments, at least one of the access devices in its ON state has lower electrical resistance and lower thermal conductivity than the first bridge.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a substrate that has an upper face;
a first electrode that is attached to the upper face of the substrate;
a second electrode that is attached to the upper face of the substrate at a distance from the first electrode;
a bridge of phase-change-memory material that is attached to and lies along the upper face of the substrate between and electrically connecting the first and second electrodes, wherein at least a portion of the bridge is thermally switchable between a low resistance solid phase and a high resistance solid phase;
access devices that are disposed between the first and second electrodes and the substrate, with the bridge being electrically connected between the access devices; and
a first resistive liner that extends along a surface of the bridge between the first and second electrodes.

2. The apparatus of claim 1, wherein the liner has an electrical resistance greater than that of the bridge in the low resistance solid phase and less than that of the bridge in the high resistance solid phase.

3. The apparatus of claim 2, wherein the first resistive liner extends along an interface between the bridge and the substrate.

4. The apparatus of claim 3, further comprising a second resistive liner that extends across a surface of the bridge that is opposite the substrate.

5. The apparatus of claim 2, wherein the first resistive liner extends between each end of the bridge and the first and second electrodes.

6. The apparatus of claim 2, wherein the first resistive liner extends between the first and second electrodes and the substrate.

7. An apparatus comprising:
a substrate that has an upper face;
a first electrode that is attached to the upper face of the substrate;
a second electrode that is attached to the upper face of the substrate at a distance from the first electrode;
a bridge of phase-change-memory material that is attached to and lies along the upper face of the substrate between and electrically connecting the first and second electrodes, wherein at least a portion of the bridge is thermally switchable between a low resistance solid phase and a high resistance solid phase; and
access devices that are disposed between the first and second electrodes and the substrate, with the bridge being electrically connected between the access devices.

8. The apparatus of claim 7, wherein the access devices are ovonic threshold switches (OTS).

9. The apparatus of claim 7, wherein at least one of the access devices in its ON state has lower electrical resistance and lower thermal conductivity than the bridge.

10. The apparatus of claim 7, wherein the bridge has a smaller cross-sectional area perpendicular to its length compared to larger cross-sectional areas of the first and second access devices perpendicular to their thicknesses.

11. An apparatus comprising:

a substrate that has an upper face;

a first metal word line that extends in a first direction across the substrate at a first distance above the substrate;

a metal bit line that extends across the substrate in a second direction that is different than the first direction, at a second distance above the substrate, which is less than the first distance;

a first word electrode that is attached to and protrudes from the upper face of the substrate below the first word line;

a first contact via that electrically connects the first word electrode to the first word line;

a first bit electrode that is attached to and protrudes from the upper face of the substrate below the metal bit line and is electrically connected to the metal bit line;

a first bridge of phase-change-memory material that is attached to and lies along the upper face of the substrate between and electrically connecting the first word electrode and the first bit electrode; and access devices that are disposed between the first word electrode and the substrate, with the first bridge being electrically connected between the access devices.

12. The apparatus of claim 11, further comprising a second metal word line that extends in the first direction across the substrate at the first distance above the substrate, and is offset by a third distance in the second direction from the first metal word line.

13. The apparatus of claim 11, wherein the first bridge has a smaller cross-sectional area perpendicular to its length compared to larger cross-sectional areas of the first and second access devices perpendicular to their thicknesses.

14. The apparatus of claim 11, wherein the access devices are ovonic threshold switches (OTS).

15. The apparatus of claim 11, further comprising a first resistive liner at a surface of the first bridge, wherein the first resistive liner is electrically connected between the first word electrode and the first bit electrode, wherein the first resistive liner has an electrical resistance greater than that of the first bridge in a low resistance state of the first bridge and less than that of the first bridge in a high resistance state of the first bridge.

16. The apparatus of claim 15, wherein the first resistive liner is atop the first bridge.

17. The apparatus of claim 15, wherein the first resistive liner is between the upper face of the substrate and the first bridge.

18. The apparatus of claim 17, further comprising a second resistive liner across a top face of the first bridge.

19. The apparatus of claim 15, wherein the first resistive liner extends between the bridge and the access devices.

20. The apparatus of claim 11, wherein at least one of the access devices in its ON state has lower electrical resistance and lower thermal conductivity than the first bridge.

* * * * *